(12) United States Patent
Hwang et al.

(10) Patent No.: US 12,262,581 B2
(45) Date of Patent: Mar. 25, 2025

(54) DISPLAY DEVICE AND METHOD OF INSPECTING THE SAME

(71) Applicant: Samsung Display Co., Ltd., Yongin-si (KR)

(72) Inventors: Taejin Hwang, Yongin-si (KR); Hyeongmin Ahn, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 440 days.

(21) Appl. No.: 17/564,854

(22) Filed: Dec. 29, 2021

(65) Prior Publication Data

US 2022/0399519 A1 Dec. 15, 2022

(30) Foreign Application Priority Data

Jun. 9, 2021 (KR) .................. 10-2021-0074976

(51) Int. Cl.
| | | |
|---|---|---|
| *H01L 51/52* | (2006.01) | |
| *G01N 21/95* | (2006.01) | |
| *H01L 27/32* | (2006.01) | |
| *H01L 51/00* | (2006.01) | |
| *H10K 50/84* | (2023.01) | |
| *H10K 59/131* | (2023.01) | |
| *H10K 77/10* | (2023.01) | |
| *H10K 102/00* | (2023.01) | |

(52) U.S. Cl.
CPC ............. *H10K 50/84* (2023.02); *G01N 21/95* (2013.01); *H10K 59/131* (2023.02); *H10K 77/111* (2023.02); *H10K 2102/311* (2023.02)

(58) Field of Classification Search
CPC ............... G01N 21/95; G01N 21/8422; G01N 2021/9513; H10K 50/84; H10K 2102/311; H10K 59/131; H10K 59/873; H10K 77/111
See application file for complete search history.

(56) References Cited

U.S. PATENT DOCUMENTS

| | | | |
|---|---|---|---|
| 2014/0097430 A1 | 4/2014 | Park et al. | |
| 2014/0368228 A1 | 12/2014 | Kim | |
| 2016/0329520 A1* | 11/2016 | Namkung | ............ H10K 59/805 |
| 2017/0170255 A1* | 6/2017 | Ha | ........................ H10K 59/131 |
| 2018/0034002 A1* | 2/2018 | Kim | ..................... H10K 50/844 |
| 2018/0097199 A1* | 4/2018 | Jo | ........................ H10K 59/873 |
| 2019/0035869 A1* | 1/2019 | Kim | ..................... H10K 59/131 |
| 2019/0361286 A1* | 11/2019 | Jang | .................. G02F 1/133371 |

(Continued)

FOREIGN PATENT DOCUMENTS

| | | |
|---|---|---|
| CN | 107403882 A | 11/2017 |
| CN | 109142447 A | 1/2019 |

(Continued)

OTHER PUBLICATIONS

Shin et al "Display Device and Manufacturing Method Thereof", Nov. 12, 2019, KR20190126746 A (Year: 2019).*

*Primary Examiner* — Sang H Nguyen

(74) *Attorney, Agent, or Firm* — CANTOR COLBURN LLP

(57) ABSTRACT

A display device includes a substrate bendable about a bending line, a display element layer above the substrate, a protection film below the substrate, and a separator between the substrate and the protection film and corresponding to the bending line.

13 Claims, 24 Drawing Sheets

(56) References Cited

U.S. PATENT DOCUMENTS

2020/0120807 A1* 4/2020 Park ...................... G06F 3/0446
2020/0401185 A1* 12/2020 Won ........................ B32B 37/30

FOREIGN PATENT DOCUMENTS

| KR | 20070076711 A | 7/2007 |
| KR | 100788823 B1 | 12/2007 |
| KR | 101965260 B1 | 4/2019 |
| KR | 102018733 B1 | 9/2019 |
| KR | 20200082608 A | 7/2020 |
| KR | 102191414 B1 | 12/2020 |
| KR | 102222724 B1 | 3/2021 |
| KR | 102229651 B1 | 3/2021 |

* cited by examiner

DISPLAY DEVICE AND METHOD OF INSPECTING THE SAME

This application claims priority to Korean Patent Application No. 10-2021-0074976, filed on Jun. 9, 2021, and all the benefits accruing therefrom under 35 U.S.C. § 119, the disclosure of which is incorporated by reference herein in its entirety.

BACKGROUND

1. Field

One or more embodiments relate to a display device, and more particularly, to a display device including a curved surface and a method of inspecting the display device.

2. Description of the Related Art

The design of display devices has become more varied. For example, curved display devices, foldable display devices, and rollable display devices have been developed. In addition, display devices have been developed to have an enlarged display area and a reduced non-display area. Accordingly, various methods for designing forms of display devices have been proposed.

SUMMARY

One or more embodiments include a display device including a curved surface. However, such a technical feature is an example, and the disclosure is not limited thereto.

Additional features will be set forth in part in the description which follows and, in part, will be apparent from the description, or may be learned by practice of the presented embodiments of the disclosure.

According to one or more embodiments, a display device includes a substrate bendable about a bending line, a display element layer above the substrate, a protection film below the substrate, and a separator between the substrate and the protection film and corresponding to the bending line.

The separator may be on a lower surface of the substrate.

The separator may be on an upper surface of the protection film.

The substrate may include a main display area on one side of the bending line and a side area on another side of the bending line and bendable at an angle with respect to the main display area, where display elements displaying an image may be in the side area.

The angle may be about 50 degrees (°) to about 100°.

The substrate may include a main display area on one side of the bending line and a side area on another side of the bending line and bendable at an angle with respect to the main display area, where wires of a circuit layer connected to the display element layer and which transmit signals may be in the side area.

The separator may include a plurality of separators, and the plurality of separators may be spaced apart from each other along the bending line.

Each of the plurality of separators may have a circular or polygonal shape.

The separator may continuous along the bending line.

The bending line may have a curved shape.

The substrate may include a first resin layer, a first barrier layer, a second resin layer, and a second barrier layer stacked on one another, where an auxiliary separator may be further between the first resin layer and the first barrier layer to correspond to the bending line.

The separator may include a material having a light transmittance and a light reflectance different from those of the substrate and the protection film.

The separator may include black ink.

According to one or more embodiments, a display device includes a substrate including a display area including a plurality of display elements and a peripheral area adjacent to the display area, a display element layer above the substrate and including the plurality of display elements, a protection film below the substrate, and a separator between the substrate and the protection film, where the separator is in the display area.

The display area of the substrate may include a main display area and a side area bendable at an angle with respect to the main display area, where the separator may at least partially overlap a boundary between the main display area and the side area.

The display area may include a main display area and a side area which is between the main display area and the peripheral area, where the separator may be around a region where the main display area and the side area meet each other.

The separator may have a closed shape corresponding to a shape of the main display area.

The separator may at least partially overlap the plurality of display elements.

The separator may include a material having a light transmittance and a light reflectance different from those of the substrate and the protection film.

According to one or more embodiments, a method of inspecting a display device including a substrate and a protection film which is below the substrate includes preparing the display device including a separator between the substrate and the protection film, inspecting a crack in a lower surface of the protection film after optically focusing a detector on the lower surface of the protection film, and inspecting a crack in a lower surface of the substrate after optically focusing the detector on the separator.

The display device may be bendable about a bending line.

The separator may be in correspondence with the bending line.

The separator may include a plurality of separators, and the plurality of separators may be spaced apart from each other along the bending line.

A display element may be above the substrate, where the display element may include an organic light-emitting diode.

The separator may include a material having a light transmittance and a light reflectance different from those of the substrate and the protection film.

The separator may include black ink.

BRIEF DESCRIPTION OF THE DRAWINGS

The above and other features, and advantages of embodiments of the disclosure will be more apparent from the following description taken in conjunction with the accompanying drawings, in which:

FIGS. 8 to 11A are plan views schematically illustrating embodiments of a lower surface of a substrate of a display panel corresponding to region IV of FIG. 7;

DETAILED DESCRIPTION

Figure 1:
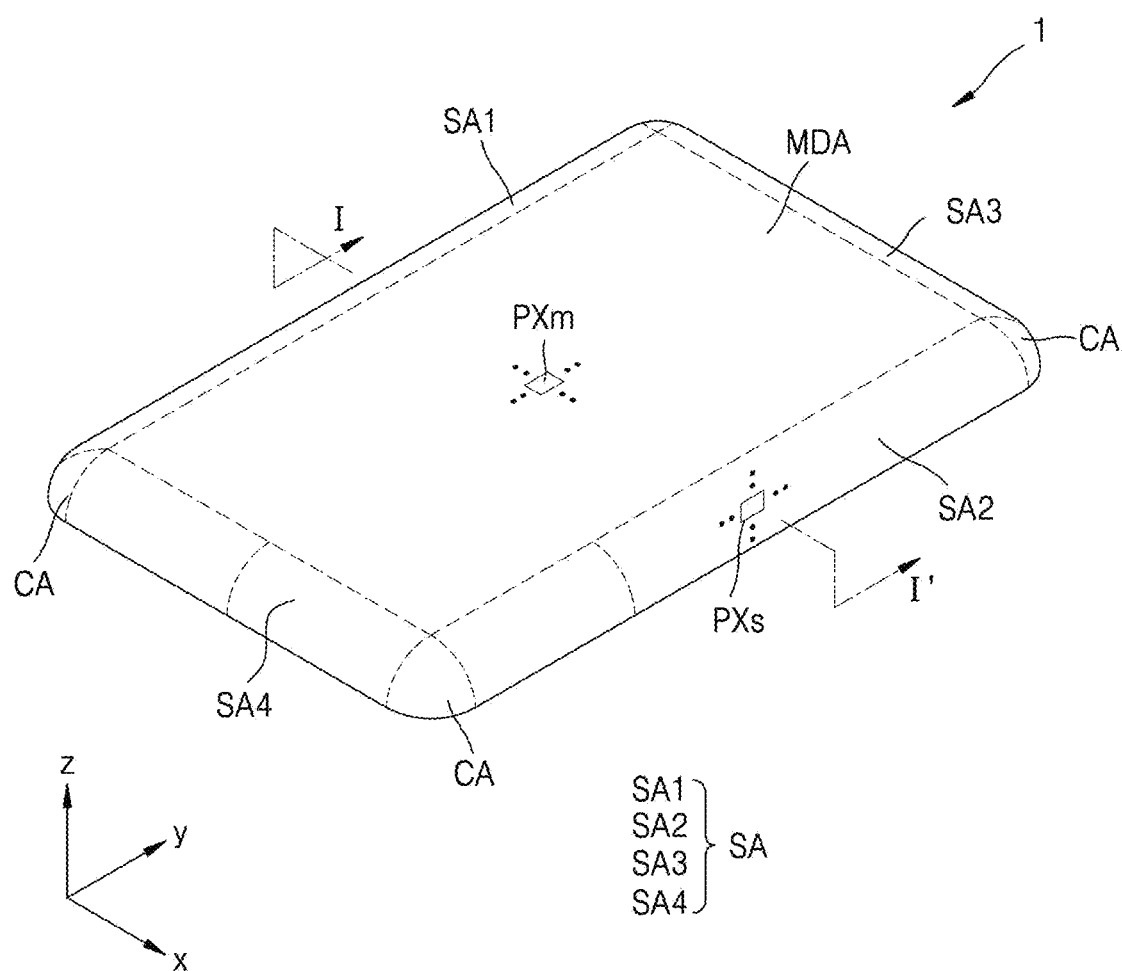
FIG. 1 is a schematic perspective view of an embodiment of a display device.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As the present description allows for various changes and numerous embodiments, embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted. As used herein, a reference number may indicate a singular element or a plurality of the element. For example, a reference number labeling a singular form of an element within the drawing figures may be used to reference a plurality of the singular element within the text of specification.

It will be understood that, when a layer, film, region, or plate is referred to as being related to another element such as being "on" another layer, film, region, or plate, it can be directly or indirectly on the other layer, film, region, or plate. That is, for example, intervening layers, films, regions, or plates may be present. In contrast, when a layer, film, region, or plate is referred to as being related to another element such as being "directly on" another layer, film, region, or plate, no other layer, film, region, or plate is present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of elements in the drawings may be exaggerated or reduced for convenience of explanation. In other words, since sizes and thicknesses of elements in the drawings are arbitrarily illustrated for convenience of explanation, the following embodiments are not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Figure 2:
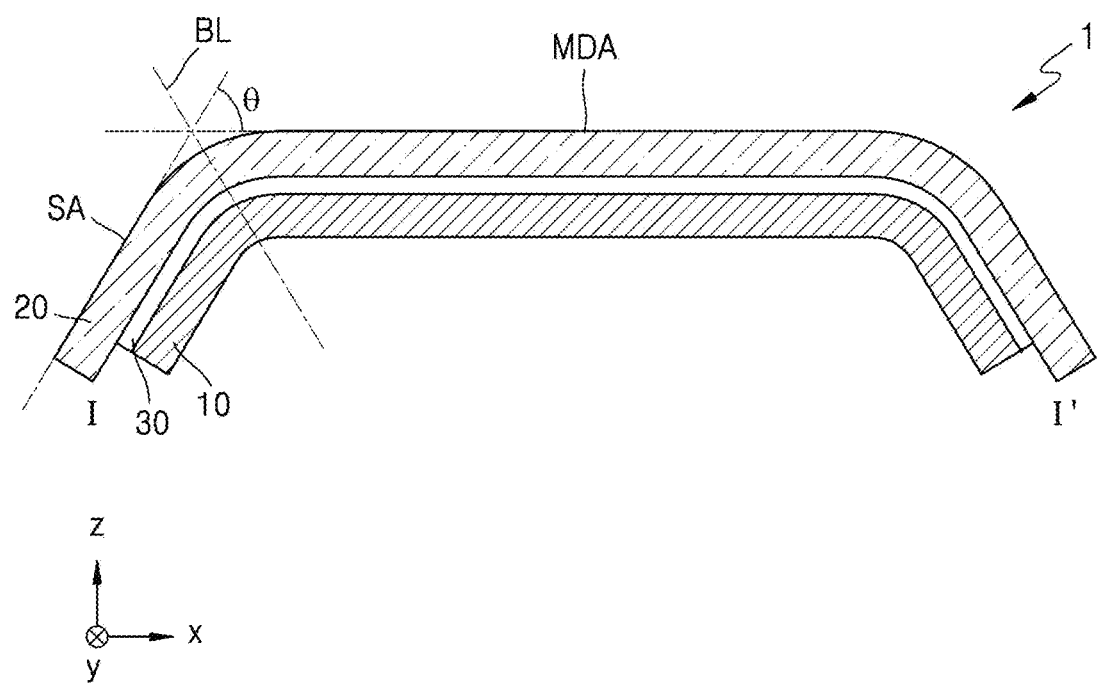
FIG. 2 is a cross-sectional view of the display device, taken along line I-I' of FIG. 1.

FIG. 1 is a schematic perspective view of an embodiment of a display device 1. FIG. 2 is a cross-sectional view of the display device 1, taken along line I-I' of FIG. 1.

The display device 1 is a device that displays a moving image or a still image. Examples of the device may include various devices that provide a display screen of not only portable electronic devices, such as a mobile phone, a smart phone, a tablet personal computer (PC), a smart watch, a watch phone, a mobile communication terminal, an electronic notebook, an e-book, a portable multimedia player (PMP), a navigation system, and an ultra-mobile PC (UMPC), but also a television, a laptop, a monitor, a billboard, and the Internet of things (IoT).

Referring to FIGS. 1 and 2, the display device 1 includes a cover window 20 and a display panel 10 facing each other.

In the present description, "above," "over," "top," and "upper surface" indicate a direction in which the cover window 20 is arranged relative to the display panel 10, that is, a direction +z, and "under," "below," "bottom," and "lower surface" indicate a direction −z relative to the display panel 10. In addition, "left," "right," "upper," and "lower" indicate directions when the display panel 10 is taken in a plan view. For example, "left" indicates a direction −x, "right" a direction x, "upper" a direction y, and "lower" a direction −y along a plane defined by a first direction (e.g., along the direction +y and/or the direction y) and a second direction (e.g., along the direction x+ and/or the direction x) which cross each other. A thickness direction of the display device 1 may be defined along a third direction (e.g., the direction +z and/or the direction z)

The display device 1 may have a rectangular shape in a plan view. In an embodiment, for example, the display device 1 may have a planar shape of a rectangle having a short side in (or along) the direction x and a long side in (or along) the direction y as shown in FIG. 1. A corner at which the short side in the direction x and the long side in the direction y meet each other may be rounded to have a curvature or may be right-angled. A planar shape of the display device 1 is not limited to a rectangle and may be another polygon, a circle, or an oval.

The display device 1 may include a main display area MDA and a side area SA. Various components or layers of the display device 1 may include a main display area MDA and a side area SA corresponding to those described above for the display device 1.

The main display area MDA is an area arranged on a front portion of the display device 1, and may be a flat area without being bent. The main display area MDA may have a rectangular shape including a short side in the direction x and a long side in the direction y. However, the disclosure is not limited thereto. The main display area MDA may have various polygonal shapes other than the rectangular shape, and may have a polygonal shape in which a corner at which a short side and a long side meet each other, is rounded.

The side area SA may include a first side area SA1, a second side area SA2, a third side area SA3, and a fourth side area SA4. The side area SA may be flat or curved. At least one of the first to fourth side areas SA1 to SA4 may be a display area displaying an image. However, the disclosure is not limited thereto. The first to fourth side areas SA1 to SA4 may be non-display areas displaying no image.

The first side area SA1 may be an area extending from a first side of the main display area MDA and bent to have a curvature along a thickness direction of the display device 1. The first side area SA1 may extend from a left side of the main display area MDA. The first side area SA1 may be an area (e.g., planar area) arranged on a left side of the display device 1.

The second side area SA2 may be an area extending from a second side of the main display area MDA and bent to have a curvature. The second side area SA2 may extend from a right side of the main display area MDA. The second side area SA2 may be an area arranged on a right side of the display device 1.

The third side area SA3 may be an area extending from a third side of the main display area MDA and bent to have a curvature. The third side area SA3 may extend from an upper side of the main display area MDA. The third side area SA3 may be an area arranged on an upper side of the display device 1.

The fourth side area SA4 may be an area extending from a fourth side of the main display area MDA and bent to have a curvature. The fourth side area SA4 may extend from a lower side of the main display area MDA. The fourth side area SA4 may be an area arranged on a lower side of the display device 1.

The first to fourth side areas SA1 to SA4 may be bent from the main display area MDA, based on a bending line BL. An angle θ respectively between the first to fourth side areas SA1 to SA4, and the main display area MDA, may be greater than 0 degrees (°). In an embodiment, for example, the angle θ may have a value between about 30° and about 120° or may have a value between about 50° and about 100°.

The display device 1 may further include one or more of a corner area CA, for example, a first corner area, a second corner area, a third corner area and a fourth corner area. The corner area CA may be an area extending from a corner of the main display area MDA and bent to have a curvature along a thickness direction of the display device 1. The corner area CA may be respectively arranged between two side areas among the first to fourth side areas SA1 to SA4 which are adjacent to each other along the main display area MDA. In an embodiment, for example, the corner area CA may be arranged between the first side area SA1 and the third side area SA3, between the first side area SA1 and the fourth side area SA4, between the second side area SA2 and the fourth side area SA4, and between the second side area SA2 and the third side area SA3.

The display device 1 may provide an image by using one or more of a main pixel PXm among a plurality of main pixels PXm arranged in the main display area MDA and/or one or more side pixel PXs among a plurality of side pixels PXs arranged in the side area SA (e.g., a display area including the main display area MDA and the side area SA). In addition, an image may be provided by using corner pixels arranged in the corner area CA. However, the disclosure is not limited thereto. The corner area CA may be a non-display area providing no image. Likewise, the side area SA may be a non-display area providing no image.

The cover window 20 may cover and protect the display panel 10. The cover window 20 may include a transparent material. The cover window 20 may include, for example, glass or plastic. When the cover window 20 includes plastic, the cover window 20 may be flexible.

A shape of the cover window 20 corresponds to a shape of the display device 1. In an embodiment, for example, when the display device 1 includes the side area SA and the corner area CA, the cover window 20 may include main portion corresponding to the main display area MDA, a side portion corresponding to the side area SA and a corner portion corresponding to the corner area CA. The side portion and the corner portion of the cover window 20 may be curved relative to the main portion, and in this case, may have a constant curvature or a varying curvature.

The display panel 10 may be arranged below the cover window 20. The cover window 20 and the display panel 10 may be coupled to each other through an adhesive member 30. That is, the display panel 10 may face the cover window 20 with the adhesive member 30 therebetween. The adhesive member 30 may be an optically clear adhesive (OCA) film or an optically clear resin (OCR).

The cover window 20 may be larger than the display panel 10 in a plan view (e.g., may have a larger planar area) and may have a side surface protruding from a side surface of the display panel 10. The cover window 20 may protrude outward (e.g., in a direction away from the main display area MDA) from each side of the display panel 10. Accordingly, when the cover window 20 and the display panel 10 are bonded to each other, the cover window 20 may cover outer portions of the display panel 10.

Figure 3:
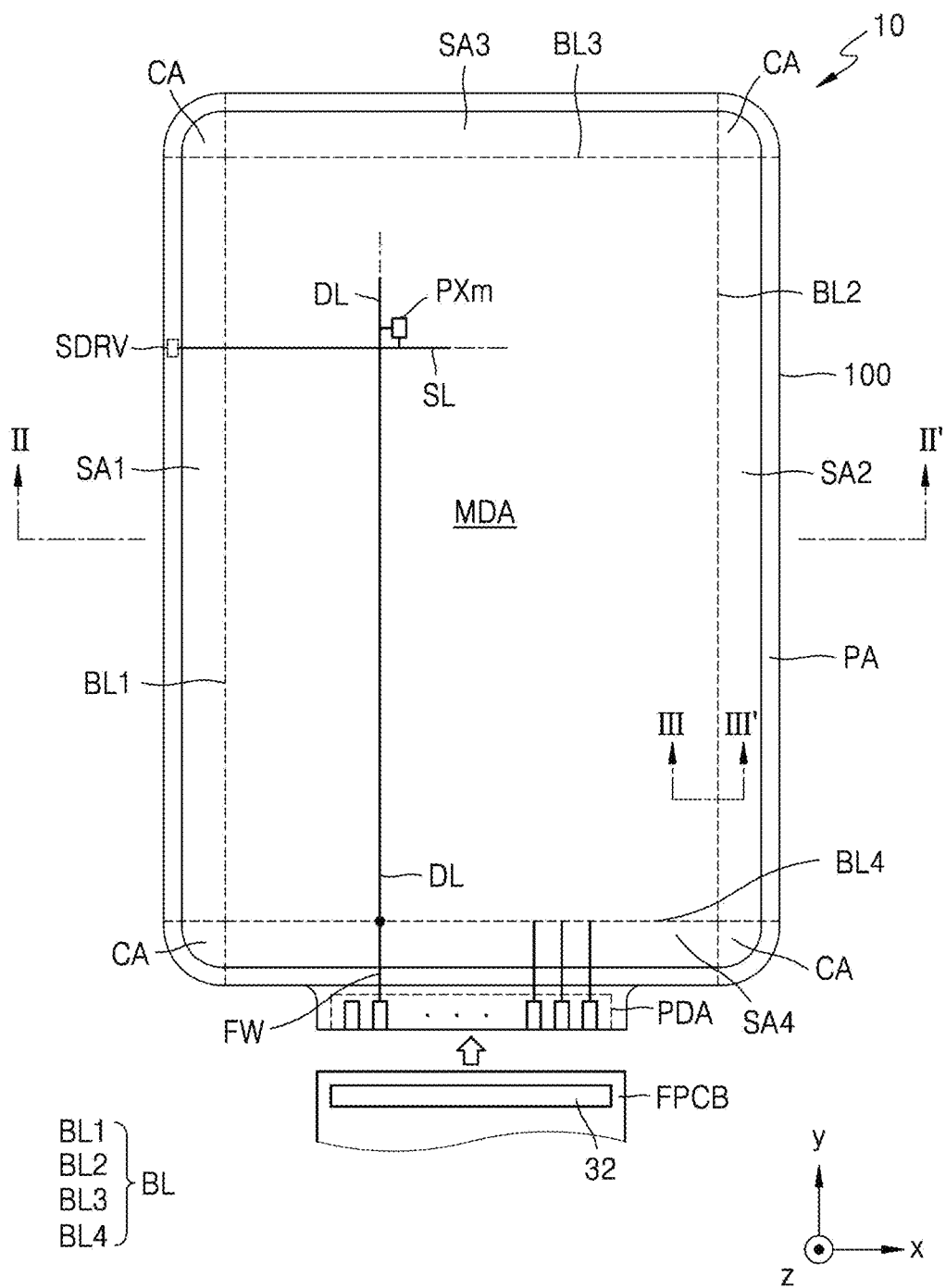
FIG. 3 is a plan view schematically illustrating an embodiment of a display panel of a display device, which is unfolded.

FIG. 3 is a plan view schematically illustrating an embodiment of the display panel 10 which is unfolded and may be included in the display device 1 of FIG. 1.

Referring to FIG. 3, various elements constituting the display panel 10 are arranged on a substrate 100. The substrate 100 includes the main display area MDA, the side area SA, the corner area CA, and a peripheral area PA. The peripheral area PA may be adjacent to a display area.

According to an embodiment, the display panel 10 may include a plurality of bending lines BL, for example, first to fourth bending lines BL1, BL2, BL3, and BL4. The display panel 10 may have sides bent to have a curved surface or bent in a vertical direction (e.g., parallel to the direction +z and/or the direction z), based on the first to fourth bending lines BL1, BL2, BL3, and BL4. The main display area MDA may be a flat area at a first side (e.g., inner side closest to the main display area MDA) of each of the first to fourth bending lines BL1, BL2, BL3, and BL4, and the side area SA may be a bent area on a second side of the each of the first to fourth bending lines BL1, BL2, BL3, and BL4 which is opposite to the first side (e.g. outer side closest to the side area SA).

The display panel 10 shown in FIG. 3 which is unfolded disposes sides of the display panel 10 as unbent (e.g., flat) based on the first to fourth bending lines BL1, BL2, BL3, and BL4. That is, the display panel 10 may be bendable about the first to fourth bending lines BL1, BL2, BL3, and BL4, to dispose the side area SA and/or the corner area CA bent or curved relative to the main display area MDA.

Among opposing sides of the display panel 10 along the direction x, the first bending line BL1 may be on the other side of the display panel 10 in the direction x and may extend in the direction y, and the second bending line BL2 may be on one side of the display panel 10 in the direction x and may extend in the direction y. Among opposing sides of the display panel 10 along the direction y, the third bending line BL3 may be on one side of the display panel 10 in the direction y and may extend in the direction x, and the fourth bending line BL4 may be on the other side of the display panel 10 in the direction y and may extend in the direction x. The first bending line BL1 and the second bending line BL2 may extend parallel to each other, and the third bending line BL3 and the fourth bending line BL4 may extend parallel to each other. Each of the first bending line BL1 and the second bending line BL2 may cross the third bending line BL3 and the fourth bending line BL4. In an embodiment, for example, each of the first bending line BL1 and the second bending line BL2 may vertically cross (e.g., be perpendicular to) the third bending line BL3 and the fourth bending line BL4, but the disclosure is not limited thereto.

In the display panel 10 which is unfolded, the first side area SA1 may be arranged at a left side of the first bending line BL1, and the main display area MDA may be arranged at a right side of the first bending line BL1. The main display area MDA may be arranged at a left side of the second bending line BL2, and the second side area SA2 may be arranged at a right side of the second bending line BL2.

In the display panel 10 which is unfolded, the third side area SA3 may be arranged at an upper side of the third bending line BL3, and the main display area MDA may be arranged at a lower side of the third bending line BL3. The main display area MDA may be arranged at an upper side of the fourth bending line BL4, and the fourth side area SA4 may be arranged at a lower side of the fourth bending line BL4.

A plurality of main pixels PXm may be arranged in the main display area MDA, and a main image may be displayed by the plurality of main pixels PXm. The main pixel PXm may include a set of a plurality of pixels. Each of the set of the plurality of pixels may emit red, green, blue, or white light.

The side area SA may be arranged at upper, lower, left, and right sides of the main display area MDA. A plurality of side pixels PXs may be arranged in at least one of the first to fourth side areas SA1 to SA4, and a side image may be displayed by the plurality of side pixels PXs. The side image may constitute one whole image together with the main image, and/or may be an image independent from the main image.

The main display area MDA may be flat, and the side area SA may be bent from the main display area MDA. The first to fourth side areas SA1, SA2, SA3, and SA4 may be bent downward with respect to the main display area MDA along the first to fourth bending lines BL1, BL2, BL3, and BL4, respectively, to be curved and define a curvature.

The corner area CA may be arranged in an area extending from a corner of the main display area MDA. The corner area CA may be arranged between two side areas among a plurality of side areas SA which are adjacent to each other, and may be bent downward with respect to the main display area MDA to be curved and define a curvature.

The display panel 10 may have a flat front and a flat lateral sides, and then may be bonded to the cover window 20 by bending of the lateral sides of the display panel 10 along the first to fourth bending lines BL1, BL2, BL3, and BL4 to each have a respective curvature.

The peripheral area PA may be arranged outside the side area SA. That is the main display area MDA, the side area SA and the peripheral area PA may be in order in a direction away from the main display area MDA. The peripheral area PA may extend from the side area SA to an outer edge of the display device 1, without being limited thereto. A scan driving circuit SDRV and a pad portion PDA may be arranged in the peripheral area PA.

The scan driving circuit SDRV may provide scan signals Sn as electrical signals for driving the main pixels PXm and the side pixels PXs. The scan driving circuit SDRV may be arranged at a right side of the second side area SA2 and/or a left side of the first side area SA1, and may be connected to a scan line SL extending in the direction x.

The pad portion PDA may be arranged at a lower side of the fourth side area SA4. The pad portion PDA is not covered by an insulating layer but is exposed to outside the display panel 10 and/or the display device 1 and is connected to a display circuit board FPCB. A display driver 32 may be arranged on the display circuit board FPCB.

The display driver 32 may generate a control signal as an electrical signal which is transmitted to the scan driving circuit SDRV of the display panel 10. In addition, the display driver 32 may generate a data signal Dm as an electrical signal. The generated data signal Dm may be transmitted to the main pixels PXm through a fan-out wire FW and a data line DL which is connected to the fan-out wire FW. The data line DL may extend in the direction y to be connected to pixel circuits which drive the main pixels PXm.

Figure 4A:
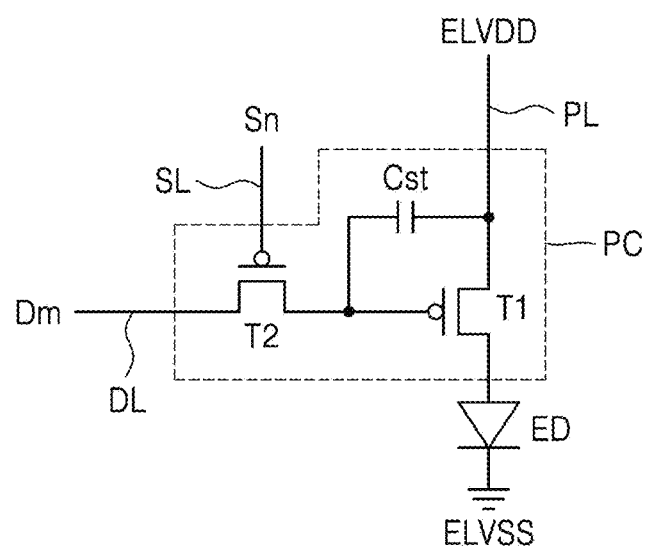
FIGS. 4A and 4B are equivalent circuit diagrams of embodiments of a pixel circuit for driving a pixel.
Figure 4B:
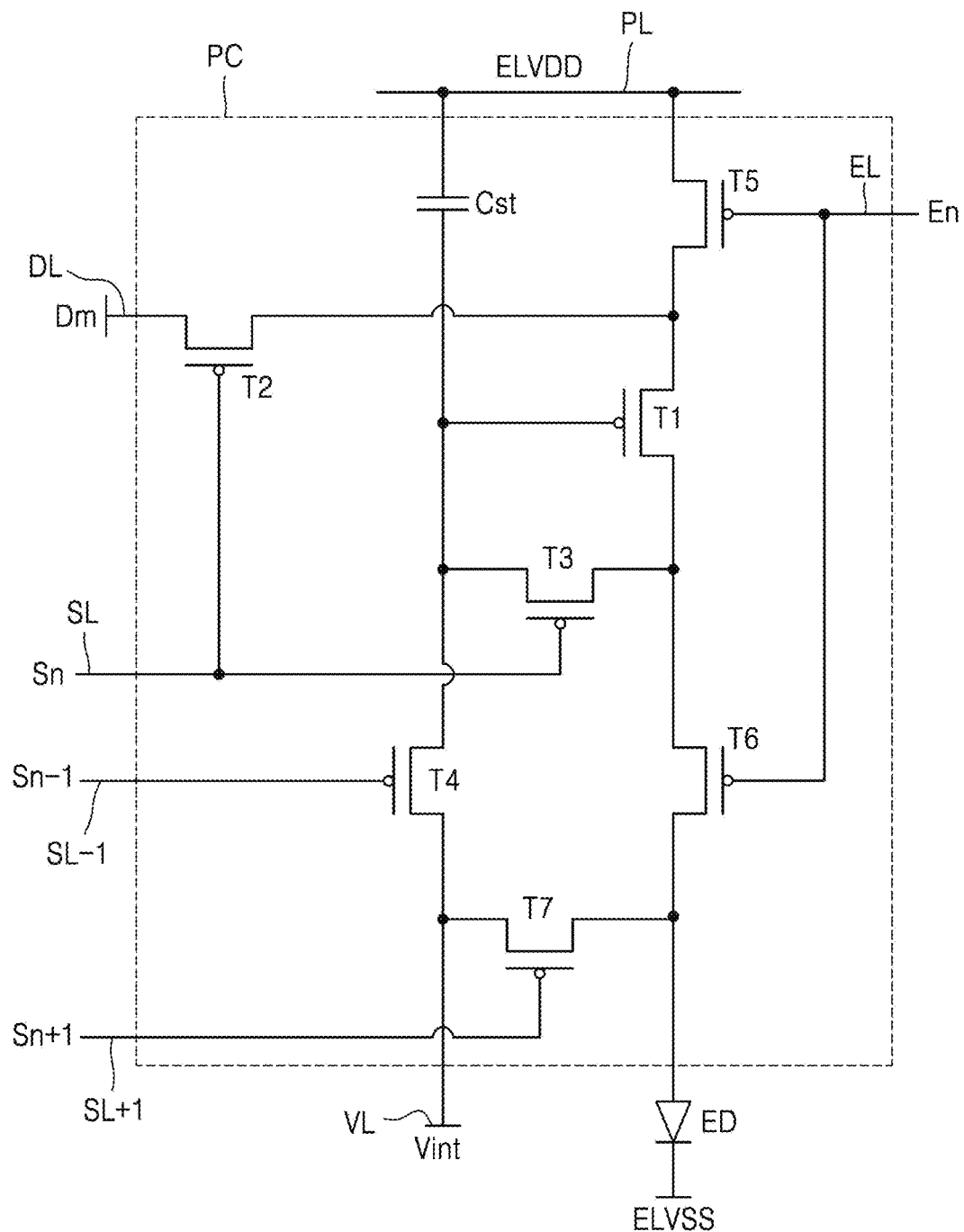

FIGS. 4A and 4B are equivalent circuit diagrams of embodiments of a pixel circuit PC for driving the main pixel PXm.

Referring to FIG. 4A, the pixel circuit PC may be connected to a light-emitting element ED to implement light emission of pixels. The pixel circuit PC includes a driving thin-film transistor T1, a switching thin-film transistor T2, and a storage capacitor Cst. The switching thin-film transistor T2 is connected to the scan line SL and the data line DL and transmits a data signal Dm input through the data line DL to the driving thin-film transistor T1 according to a scan signal Sn input through the scan line SL.

The storage capacitor Cst is connected to the switching thin-film transistor T2 and a driving voltage line PL and stores a voltage corresponding to a difference between a voltage received from the switching thin-film transistor T2 and a driving voltage ELVDD supplied to the driving voltage line PL.

The driving thin-film transistor T1 is connected to the driving voltage line PL and the storage capacitor Cst and may control a driving (electrical) current flowing through the light-emitting element ED from the driving voltage line PL in response to a voltage value stored in the storage capacitor Cst. The light-emitting element ED may emit light having a brightness according to the driving current.

Although a case in which the pixel circuit PC includes two thin-film transistors and one storage capacitor has been described with reference to FIG. 4A, the disclosure is not limited thereto.

Referring to FIG. 4B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 4B shows signal lines, for example, the scan line SL, a previous scan line SL−1, a next scan line SL+1, an emission control line EL, and the data line DL, an initialization voltage line VL, and the driving voltage line PL provided for each pixel circuit PC, the disclosure is not limited thereto. In an embodiment, at least one of signal lines, for example, the scan line SL, the previous scan line SL−1, the next scan line SL+1, the emission control line EL, and the data line DL, and/or the initialization voltage line VL may be shared by neighboring pixel circuits PC.

A drain electrode of the driving thin-film transistor T1 may be electrically connected to the light-emitting element ED via the emission control thin-film transistor T6. The driving thin-film transistor T1 receives the data signal Dm according to a switching operation of the switching thin-film transistor T2 and supplies a driving current to the light-emitting element ED.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1 and may also be connected to the driving voltage line PL via the operation control thin-film transistor T5.

The switching thin-film transistor T2 is turned on according to the scan signal Sn received through the scan line SL to perform a switching operation for transmitting the data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may also be connected to a pixel electrode 121 of the light-emitting element ED via the emission control thin-film transistor T6. A drain electrode of the compensation thin-film transistor T3 may be connected to one electrode (e.g., a first electrode) of the storage capacitor Cst, a source electrode of the first initialization thin-film transistor T4, and a gate electrode of the driving thin-film transistor T1. The compensation thin-film transistor T3 is turned on according to the scan signal Sn received through the scan line SL to diode-connect the driving thin-film transistor T1 by connecting the gate electrode and the drain electrode of the driving thin-film transistor T1 to each other.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1 to perform an initialization operation for initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL.

A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode 121 of the light-emitting element ED. As the operation control thin-film transistor T5 and the emission control thin-film transistor T6 are simultaneously turned on according to an emission control signal En received through the emission control line EL, the driving voltage ELVDD is transmitted to the light-emitting element ED, and a driving current flows through the light-emitting element ED to emit light.

A gate electrode of the second initialization thin-film transistor T7 may be connected to the next scan line SL+1. A source electrode of the second initialization thin-film transistor T7 may be connected to the pixel electrode 121 of the light-emitting element ED. A drain electrode of the second initialization thin-film transistor T7 may be connected to the initialization voltage line VL. The second initialization thin-film transistor T7 may be turned on according to a next scan signal Sn+1 received through the next scan line SL+1 to initialize the pixel electrode 121 of the light-emitting element ED.

Although FIG. 4B shows the first initialization thin-film transistor T4 and the second initialization thin-film transistor T7 respectively connected to the previous scan line SL−1 and the next scan line SL+1, the disclosure is not limited thereto. In an embodiment, the first initialization thin-film transistor T4 and the second initialization thin-film transistor T7 may both be connected to the previous scan line SL−1 and driven according to the previous scan signal Sn−1.

The other electrode (e.g., second electrode) of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode) of the light-emitting element ED receives a common voltage ELVSS. The light-emitting element ED receives a driving current from the driving thin-film transistor T1 and emits light.

The pixel circuit PC is not limited to the number of thin-film transistors and storage capacitors and the circuit design described with reference to FIGS. 4A and 4B, and the number and circuit design may be variously changed.

Pixel circuits PC for driving the main pixel PXm and the side pixel PXs may be the same as each other or may be different from each other. In an embodiment, for example, the pixel circuits PC for driving the main pixel PXm and the side pixel PXs may each be the pixel circuit PC shown in FIG. 4B. In an embodiment, the pixel circuit PC for driving the main pixel PXm may employ the pixel circuit PC shown in FIG. 4B, and the pixel circuit PC for driving the side pixel PXs may employ the pixel circuit PC shown in FIG. 4A.

Figure 5:
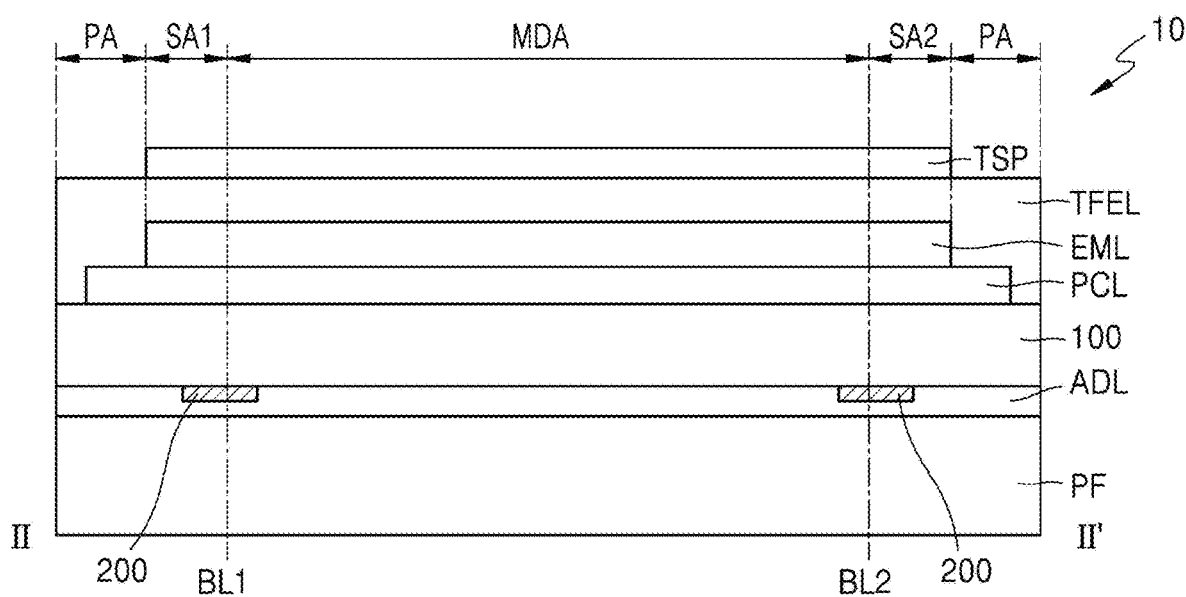
FIG. 5 is a cross-sectional view schematically illustrating an embodiment of a portion of a display panel taken along line II-II' of FIG. 3.

FIG. 5 is a cross-sectional view schematically illustrating an embodiment of a portion of the display panel 10 which is flat, and is a schematic cross-sectional view of the display panel 10 taken along line II-II' of FIG. 3.

Referring to FIG. 5, the display panel 10 may include the substrate 100, and a circuit layer PCL, a display element layer EML, a thin film encapsulation layer TFEL, a touchscreen layer TSP, and an optical functional layer (not shown). The circuit layer PCL, the display element layer EML, the thin film encapsulation layer TFEL, the touchscreen layer TSP, and the optical functional layer may be in order from the substrate 100 along the thickness direction, without being limited thereto. In addition, the display panel 10 may include a protection film PF arranged below the substrate 100. A separator 200 may be arranged between the substrate 100 and the protection film PF.

The substrate 100 may include an insulating material such as glass, quartz, or polymer resin. The substrate 100 may be a rigid substrate or may be a flexible substrate capable of bending, folding, rolling, etc.

The circuit layer PCL may be arranged on the substrate 100. The circuit layer PCL includes pixel circuits for driving each pixel. The various pixel circuits may include a plurality of thin-film transistors and a capacitor. Not only pixel circuits for driving each pixel but also scan lines, data lines, power lines, scan control lines, and link lines which connect pads and data lines to each other may be formed (or provided) within the circuit layer PCL.

The display element layer EML including a light-emitting element ED which is a display element, and a pixel-defining layer PDL which defines an emission area of the light-emitting element ED, may be arranged on the circuit layer PCL. In an embodiment, the circuit layer PCL may be connected to the display element layer EML.

The thin film encapsulation layer TFEL may be arranged on the display element layer EML. The thin film encapsulation layer TFEL prevents (or effectively reduces) penetration of oxygen or moisture into the display element layer EML. To this end, the thin film encapsulation layer TFEL may include at least one inorganic encapsulation layer. The inorganic encapsulation layer may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$) and may be formed by chemical vapor deposition (CVD) or the like.

In addition, the thin film encapsulation layer TFEL may include at least one organic encapsulation layer. The organic encapsulation layer may include a polymer-based material. Examples of the polymer-based material may include silicon-based resin, acryl-based resin, epoxy-based resin, polyimide (PI), and polyethylene.

The touchscreen layer TSP may obtain coordinate information according to an external input, for example, a touch event. The touchscreen layer TSP may include a touch electrode and touch wires which are connected to the touch electrode. The touchscreen layer TSP may sense an external input to the display panel 10 and/or the display device 1 in a self-capacitance manner or a mutual capacitance manner.

The touchscreen layer TSP may be formed on the thin film encapsulation layer TFEL as a base layer. Alternatively, the touchscreen layer TSP may be separately formed on a touch substrate and then be coupled to the thin film encapsulation layer TFEL such as through an adhesive layer such as an OCA. In an embodiment, the touchscreen layer TSP may be directly formed on the thin film encapsulation layer TFEL, and in this case, no adhesive layer may be arranged between the touchscreen layer TSP and the thin film encapsulation layer TFEL.

The optical functional layer may include an anti-reflection layer. The anti-reflection layer may decrease reflectance of incident light (e.g., external light) externally travelling toward the display device 1. In embodiments, the optical functional layer may be a polarizing film. In embodiments, the optical functional layer may include a filter plate including a black matrix and color filters.

The display panel 10 may be a light-emitting display panel including a light-emitting element ED. In an embodiment, for example, the display panel 10 may be an organic light-emitting display panel using an organic light-emitting diode as a light-emitting element ED, a micro light-emitting diode (micro LED) display panel using a micro LED as a light-emitting element ED, a quantum dot organic light-emitting display panel using quantum dots and an organic light-emitting diode, or an inorganic light-emitting display panel using an inorganic semiconductor as a light-emitting element ED. Hereinafter, a case in which the display panel 10 is an organic light-emitting display panel will be mainly described.

The protection film PF is a member for protecting a lower surface 100B of the substrate 100, and may include polyethylene terephthalate (PET) or PI.

The protection film PF may be attached to the lower surface 100B of the substrate 100 by the adhesive layer ADL. The adhesive layer ADL may include a pressure-sensitive adhesive (PSA).

During a process of attaching the protection film PF having the adhesive layer ADL, to the lower surface 100B of the substrate 100 which is closes to the protection film PF, bubbles which are trapped between the lower surface 100B of the substrate 100 and the adhesive layer ADL are minimized. To minimize the trapped bubbles, a surface of the adhesive layer ADL may have bumpy, fine unevenness so that air may be allowed to move in a direction +x through fine unevenness in the surface of the adhesive layer ADL as attachment of the protection film PF starts from one side of the substrate 100, for example, an edge of the substrate 100 in the direction −x, and goes on to the direction +x. Thus, the protection film PF which is finally attached to the lower surface 100B of the substrate 100 includes trapped bubbles between the protection film PF and the substrate 100 being prevented or reduced. A surface of the adhesive layer ADL may have the bumpy, fine unevenness through various methods. In an embodiment, for example, by using a mold having a mold surface having bumpy, fine unevenness, the mold surface may be pressed against the adhesive layer ADL, and thus, a surface of the adhesive layer ADL may come to have bumpy, fine unevenness.

The separator 200 may be provided in plural including a plurality of separators 200 which are arranged between the substrate 100 and the protection film PF to respectively correspond to the first and second bending lines BL1 and BL2. That is, on or at a boundary between the main display area MDA and the side area SA, the separator 200 may be arranged between the substrate 100 and the protection film PF. The separator 200 may be a configuration for detecting a crack (e.g., crack detector) that may occur in the substrate 100.

When an external pressure such as bending of the display panel 10 is applied, a micro-sized crack may occur. The micro-sized crack does not cause failure of the display panel 10. However, when the micro-sized crack grows to a large-sized crack as the display device 1 is used, failure of the display panel 10 may be caused. The micro-sized crack occurs mainly at the lower surface 100B of the substrate 100 which is furthest from the circuit layer PCL, the display element layer EML, the thin film encapsulation layer TFEL, and may proceed to the inside of the substrate 100. The substrate 100 and the protection film PF of the display panel 10 may include a material that is transparent with respect to light, and in this case, it may be difficult to focus on the lower surface 100B of the substrate 100 such as for inspection of the display device 1.

According to one or more embodiments, a micro-sized crack that may occur in the lower substrate of the substrate 100 may be detected easily by introducing the separator 200 having a different light transmittance or light reflectance from the substrate 100 and the protection film PF.

The separator 200 may include a material on the lower surface 100B of the substrate 100 and having a different light transmittance or light reflectance from those of the substrate 100 and the protection film PF. The separator 200 extends from the lower surface 100B of the substrate 100, in a direction toward the protection film PF. A distal end of the separator 200 which is furthest from the substrate 100 may be spaced apart from the protection film PF, and a portion of the adhesive layer ADL may be between the distal end of the separator 200 and the protection film PF. In an embodiment, for example, the separator 200 may be formed (or provided) by performing printing on the lower surface 100B of the substrate 100 with ink or coating the lower surface 100B of the substrate 100 with ink. The ink may be black. Alternatively, the separator 200 may be formed by applying one of black resin, graphite powder, black spray, and black enamel. Alternatively, the separator 200 may be formed by depositing and patterning an opaque thin film.

Figure 6A:
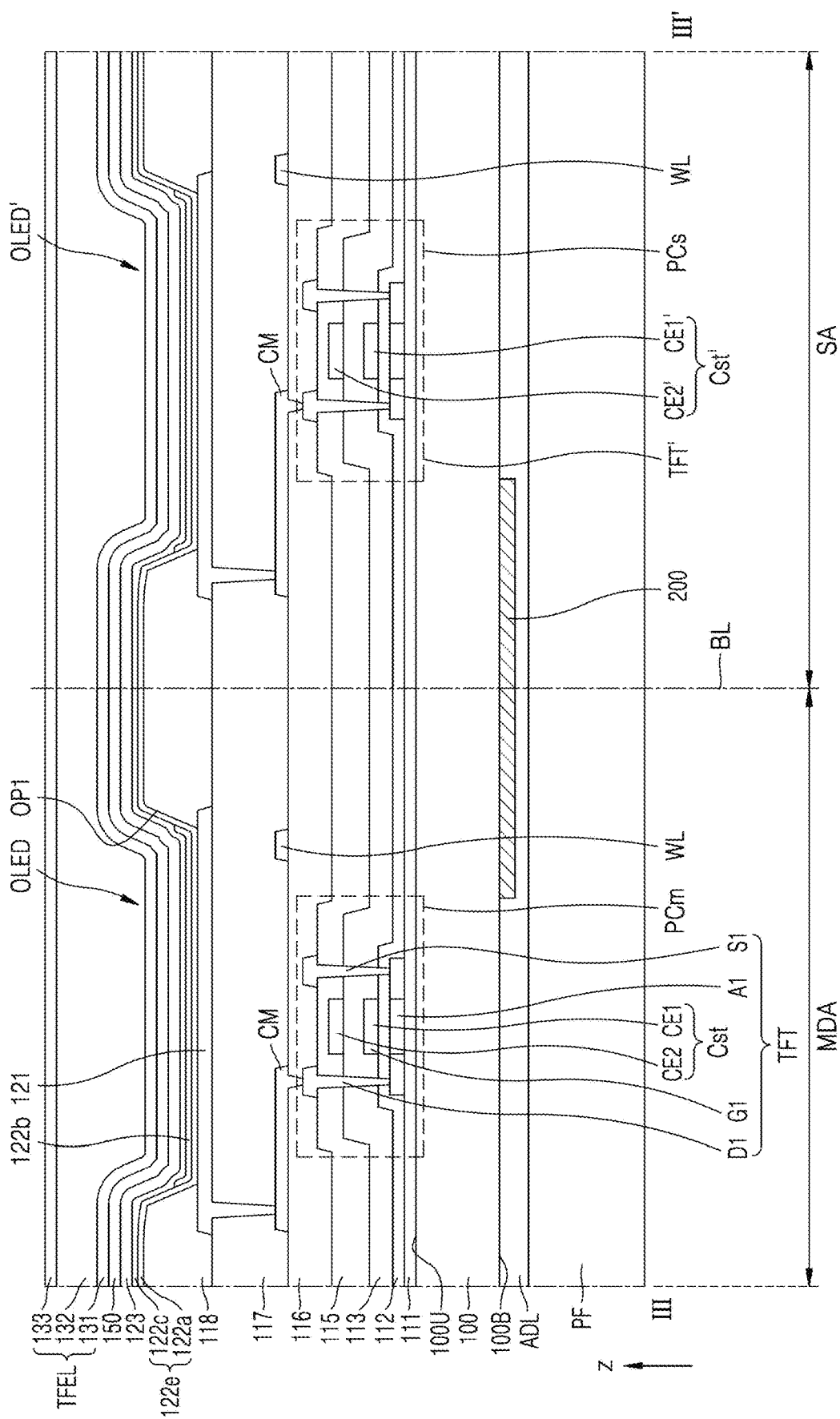
FIGS. 6A and 6B are cross-sectional views schematically illustrating embodiments of a portion of a display panel taken along line III-Ill' of FIG. 3.
Figure 6B:
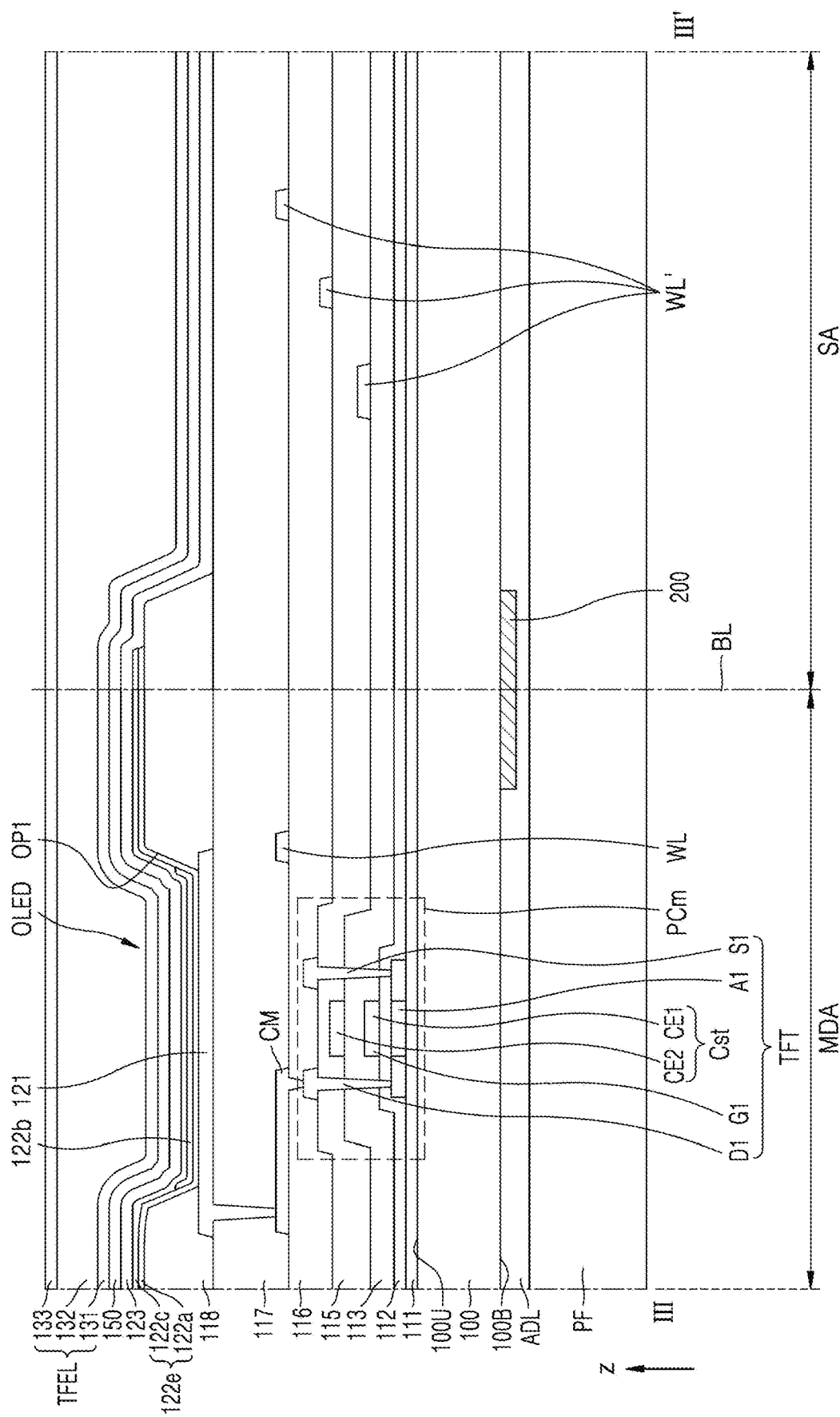

FIGS. 6A and 6B are cross-sectional views schematically illustrating an embodiment of a portion of the display panel 10, and are schematic cross-sectional views of the display panel 10, taken along line III-III' of FIG. 3.

Referring to FIG. 6A, a main pixel circuit PCm including a thin-film transistor TFT and the storage capacitor Cst and a main organic light-emitting diode OLED as a display element which is connected to the main pixel circuit PCm may be arranged in the main display area MDA. A side pixel circuit PCs including a thin-film transistor TFT' and a storage capacitor Cst' and a side organic light-emitting diode OLED' as a display element which is connected to the side pixel circuit PCs may be arranged in the side area SA. Configurations of the side pixel circuit PCs and the side organic light-emitting diode OLED' are similar to those of the main pixel circuit PCm and the main organic light-emitting diode OLED, respectively, and thus, descriptions thereof are replaced with those of the main pixel circuit PCm and the main organic light emitting diode OLED.

The main display area MDA and the side area SA of the display panel 10 may be bent at a bending angle, based on the bending line BL. FIG. 6A shows the display panel 10 which is unfolded or flat, such as before being bent. The separator 200 may be arranged in correspondence with the bending line BL. That is, the separator 200 may be arranged at a region where the main display area MDA and the side area SA meet each other. The separator 200 may at least partially overlap a boundary defined between the main display area MDA and the side area SA.

Hereinafter, a stacked structure of the display panel 10 will be described.

The substrate 100 may include an insulating material such as glass, quartz, or polymer resin. The substrate 100 may be a rigid substrate or may be a flexible substrate capable of bending, folding, rolling, etc. In embodiments, the substrate 100 may have a stacked structure of a substrate organic layer/a substrate inorganic layer/a substrate organic layer.

The protection film PF is below a lower surface 100B of the substrate 100 and may be attached to the lower surface 100B of the substrate 100 by the adhesive layer ADL. The protection film PF protects the lower surface 100B of the substrate 100, and may include PET or PI. The adhesive layer ADL may include a PSA.

The separator 200 is arranged in correspondence with the bending line BL and may be arranged between the substrate 100 and the protection film PF. The separator 200 may be arranged on the lower surface 100B of the substrate 100. In this case, the separator 200 may be provided by a material or pattern applied to or deposited on the lower surface 100B of the substrate 100 and thus may be formed. The separator 200 may be formed by applying one of black ink, black resin, graphite power, black spray, and black enamel, or may be formed by depositing an opaque thin film.

A buffer layer 111 is on an upper surface 100U of the substrate 100 and may reduce or block penetration of a foreign material, moisture, or external air from below the substrate 100 and provide a flat surface on the substrate 100. The buffer layer 111 may include an inorganic material such as oxide or nitride, an organic material, or an organic-inorganic complex material and may have a single-layer or multi-layer structure of an inorganic material and an organic material. A barrier layer (not shown) for preventing penetration of external air may be further between the substrate 100 and the buffer layer 111. In embodiments, the buffer layer 111 may include silicon oxide ($SiO_2$) or silicon nitride ($SiN_x$).

The thin-film transistor TFT may be arranged on the buffer layer 111. The thin-film transistor TFT includes a first semiconductor layer A1, a first gate electrode G1, a first source electrode S1, and a first drain electrode D1. The thin-film transistor TFT may be connected to the main organic light-emitting diode OLED to drive the main organic light-emitting diode OLED.

The first semiconductor layer A1 is arranged on the buffer layer 111 and may include polysilicon. In an embodiment, the first semiconductor layer A1 may include amorphous silicon. In an embodiment, the first semiconductor layer A1 may include oxide of at least one material selected from indium (In), gallium (Ga), tin (Sn), zirconium (Zr), vanadium (V), hafnium (Hf), cadmium (Cd), germanium (Ge), chromium (Cr), titanium (Tl), and zinc (Zn). The first semiconductor layer A1 may include a channel region and source and drain regions doped with impurities.

A first gate insulating layer 112 may be provided to cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may have a single-layer or multi-layer structure including the inorganic insulating material described above.

The first gate electrode G1 is arranged on the first gate insulating layer 112 to overlap the first semiconductor layer A1. The first gate electrode G1 may include molybdenum (Mo), aluminum (Al), copper (Cu), titanium (Ti), etc. and may have a single-layer or multi-layer structure. In an embodiment, for example, the first gate electrode G1 may be a single layer including molybdenum (Mo).

A second gate insulating layer 113 may cover the first gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may have a single-layer or multi-layer structure including the inorganic insulating material described above.

An upper electrode CE2 of the storage capacitor Cst may be arranged on the second gate insulating layer 113. The upper electrode CE2 of the storage capacitor Cst may overlap the first gate electrode G1 below the upper electrode CE2. The first gate electrode G1 and the upper electrode CE2 overlapping each other with the second gate insulating layer 113 therebetween may constitute the storage capacitor Cst. The first gate electrode G1 may be a lower electrode CE1 of the storage capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu) and may have a single-layer or multi-layer structure of the material described above.

An interlayer insulating layer 115 may cover the upper electrode CE2. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer insulating layer 115 may have a single-layer or multi-layer structure including the inorganic insulating material described above.

The first source electrode S1 and the first drain electrode D1 may be arranged on the interlayer insulating layer 115. The first source electrode S1 and the first drain electrode D1 may include a conductive material including molybdenum (Mo), aluminum (Al), copper (Cu), titanium (Ti), etc. and may have a multi-layer or single-layer structure including the material described above. In an embodiment, for example, the first source electrode S1 and the first drain electrode D1 may have a multi-layer structure of Ti/Al/Ti.

A first organic insulating layer 116 may be arranged on source electrode S1 and drain electrode D1. The first organic insulating layer 116 may include a polymer such as photosensitive PI, PI, polycarbonate (PC), benzocyclobutene (BCB), hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like.

Alternatively, the first organic insulating layer 116 may include a siloxane-based organic material. The siloxane-based organic material may include hexamethyldisiloxane, octamethyltrisiloxane, decamethyltetrasiloxane, dodecamethylpentasiloxane, and polydimethylsiloxanes.

A connection electrode CM and one or more of a wire WL among a plurality of wires WL, for example, a driving voltage line or a data signal line, may be arranged on the first organic insulating layer 116, which may be favorable for high integration.

A second organic insulating layer 117 on the first organic insulating layer 116 may cover the connection electrode CM and the wire WL. The second organic insulating layer 117 may have a flat upper surface so that a pixel electrode 121 arranged thereon may be flat. The second organic insulating layer 117 may include a siloxane-based organic material having high light transmittance and flatness. The siloxane-based organic material may include hexamethyldisiloxane, octamethyltrisiloxane, decamethyltetrasiloxane, dodecamethylpentasiloxane, and polydimethylsiloxanes.

Alternatively, the second organic insulating layer 117 may include a polymer such as photosensitive PI, PI, BCB, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like.

The main organic light-emitting diode OLED may be arranged on the second organic insulating layer 117. The pixel electrode 121 of the main organic light-emitting diode OLED may be connected to the main pixel circuit PCm through the connection electrode CM arranged on the first organic insulating layer 116.

The pixel electrode 121 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 121 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, for example, the pixel electrode 121 may have a structure having films on/under the reflective film described above and including ITO, IZO, ZnO, or $In_2O_3$. In this case, the pixel electrode 121 may have a stacked structure of ITO/Ag/ITO.

A pixel-defining layer 118 on the second organic insulating layer 117 may cover the edge of the pixel electrode 121 and may include or define a first opening OP1 exposing a central portion of the pixel electrode 121 to outside of the pixel-defining layer 118. Emission areas (e.g., a light emission area) of the main and side organic light-emitting diodes OLED and OLED', that is, size and shape of the main and side pixels PXm and PXs, are defined by the first opening OP1.

The pixel-defining layer 118 may prevent an electrical arc, etc. from occurring at the edge of the pixel electrode 121 by increasing a distance between the edge of the pixel electrode 121 and an opposite electrode 123 which is arranged over the pixel electrode 121. The pixel-defining layer 118 may include an organic insulating material such as PI, polyamide, acrylic resin, BCB, HMDSO, and phenolic resin and may be formed by a method such as spin coating.

A first emission layer 122b formed in correspondence with the pixel electrode 121 is arranged in the first opening OP1 of the pixel-defining layer 118. The first emission layer 122b may include a polymer material or a low-molecular weight material and may emit red, green, blue, or white light.

An organic functional layer 122e may be arranged on and/or under the first emission layer 122b. The organic functional layer 122e may include a first functional layer 122a and/or a second functional layer 122c. The first functional layer 122a or the second functional layer 122c may be omitted.

The first functional layer 122a may be arranged under the first emission layer 122b. The first functional layer 122a may have a single-layer or multi-layer structure including an organic material. The first functional layer 122a may be a hole transport layer (HTL) having a single-layer structure. Alternatively, the first functional layer 122a may include a hole injection layer (HIL) and an HTL. The first functional layer 122a may be integrally formed to correspond to main organic light-emitting diodes OLED included in the main display area MDA.

The second functional layer 122c may be arranged above the first emission layer 122b. The second functional layer 122c may have a single-layer or multi-layer structure including an organic material. The second functional layer 122c may include an electron transport layer (ETL) and/or an electron injection layer (EIL). The second functional layer 122c may be integrally formed to correspond to the main organic light-emitting diodes OLED included in the main display area MDA.

The opposite electrode 123 is arranged on the second functional layer 122c. The opposite electrode 123 may include a conductive material having a low work function. In an embodiment, for example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 123 may further include a layer, such as ITO, IZO, ZnO, or $In_2O_3$, on a (semi)transparent layer including the material described above. The opposite electrode 123 may be integrally formed to correspond to the main and side organic light-emitting diodes OLED and OLED' included in the main display area MDA and the side area SA, respectively.

Layers from the pixel electrode 121 to the opposite electrode 123 which are formed in the main display area MDA may constitute the main organic light-emitting diode OLED.

An upper layer 150 including an organic material may be formed on the opposite electrode 123. The upper layer 150 may be a layer for protecting the opposite electrode 123 and increasing out-coupling efficiency. The upper layer 150 may include an organic material having a higher refractive index than that of the opposite electrode 123. Alternatively, layers having different refractive indices may be stacked in the upper layer 150. In an embodiment, for example, a high refractive index layer/a low refractive index layer/a high refractive index layer may be stacked in the upper layer 150. In this regard, a refractive index of the high refractive index layer may be about 1.7 or greater, and a refractive index of the low refractive index layer may be about 1.3 or less.

The upper layer 150 may additionally include lithium fluoride (LiF). Alternatively, the upper layer 150 may additionally include an inorganic insulating material such as silicon oxide ($SiO_2$) or silicon nitride ($SiN_x$).

The thin film encapsulation layer TFEL may be arranged on the upper layer 150. The thin film encapsulation layer TFEL may reduce or effectively prevent penetration of external moisture or a foreign material into the main organic light-emitting diode OLED.

The thin film encapsulation layer TFEL may include at least one inorganic encapsulation layer and at least one organic encapsulation layer. In this regard, FIG. 6A shows the thin film encapsulation layer TFEL having a structure in which a first inorganic encapsulation layer 131, an organic encapsulation layer 132, and a second inorganic encapsulation layer 133 are stacked in order. In an embodiment, the number of organic encapsulation layers, the number of inorganic encapsulation layers, and the stacking order may be changed.

The first inorganic encapsulation layer 131 and the second inorganic encapsulation layer 133 may include one or more inorganic insulating materials such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by CVD or the like. The organic encapsulation layer 132 may include a polymer-based material. Examples of the polymer-based material may include silicon-based resin, acryl-based resin, epoxy-based resin, PI, and polyethylene. The first inorganic encapsulation layer 131, the organic encapsulation layer 132, and the second inorganic encapsulation layer 133 may be integrally formed to cover the main display area MDA.

In FIG. 6A, the separator 200 is arranged around or at a region where the main display area MDA and the side area SA meet each other. Accordingly, the separator 200 may at least partially overlap the main and side organic light-emitting diodes OLED and OLED' arranged in a display area. That is, the separator 200 may at least partially overlap the main organic light-emitting diode OLED arranged in the main display area MDA and the side organic light-emitting diode OLED' arranged in the side area SA.

Although the configuration in which the side pixel circuit PCs and the side organic light-emitting diode OLED' are both arranged in the side area SA has been described with reference to FIG. 6A, the disclosure is not limited thereto.

As shown in FIG. 6B, various modifications may be made, for example, wires WL' may be arranged in the side area SA instead of the side pixel circuit PCs and the side organic light-emitting diode OLED'. The wires WL' may be arranged on various layers, for example, the second gate insulating layer 113, the interlayer insulating layer 115 and/or the first organic insulating layer 116.

Figure 7:
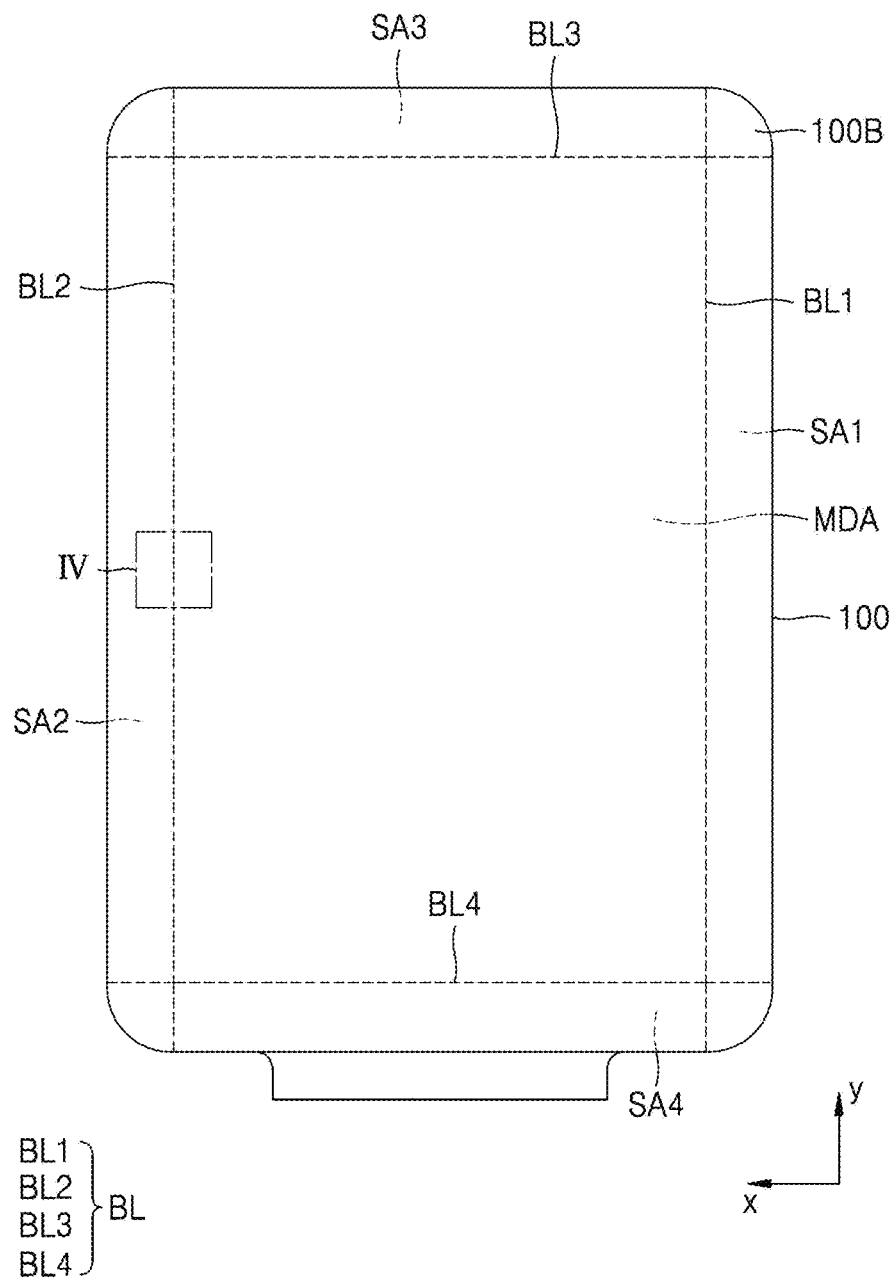
FIG. 7 is a plan view schematically illustrating an embodiment of a lower surface of a substrate of a display panel.
Figure 11A:
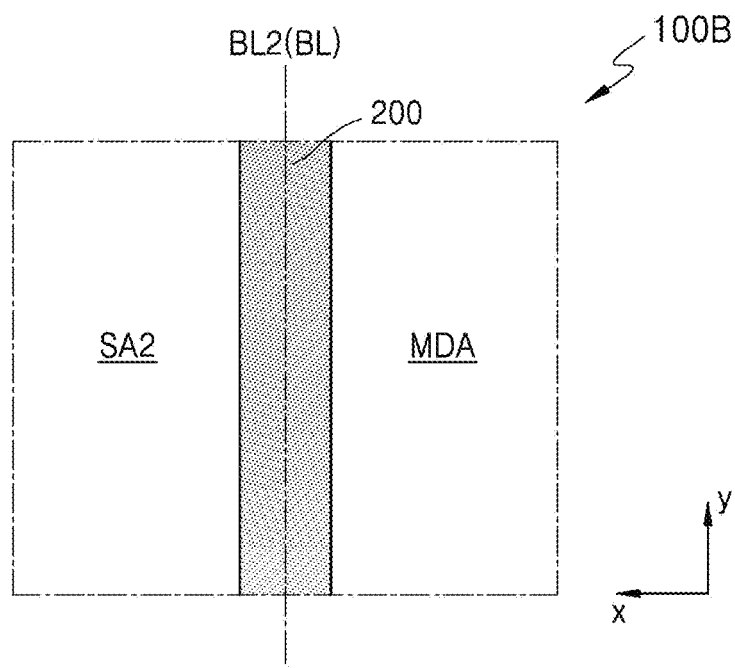
Figure 11B:
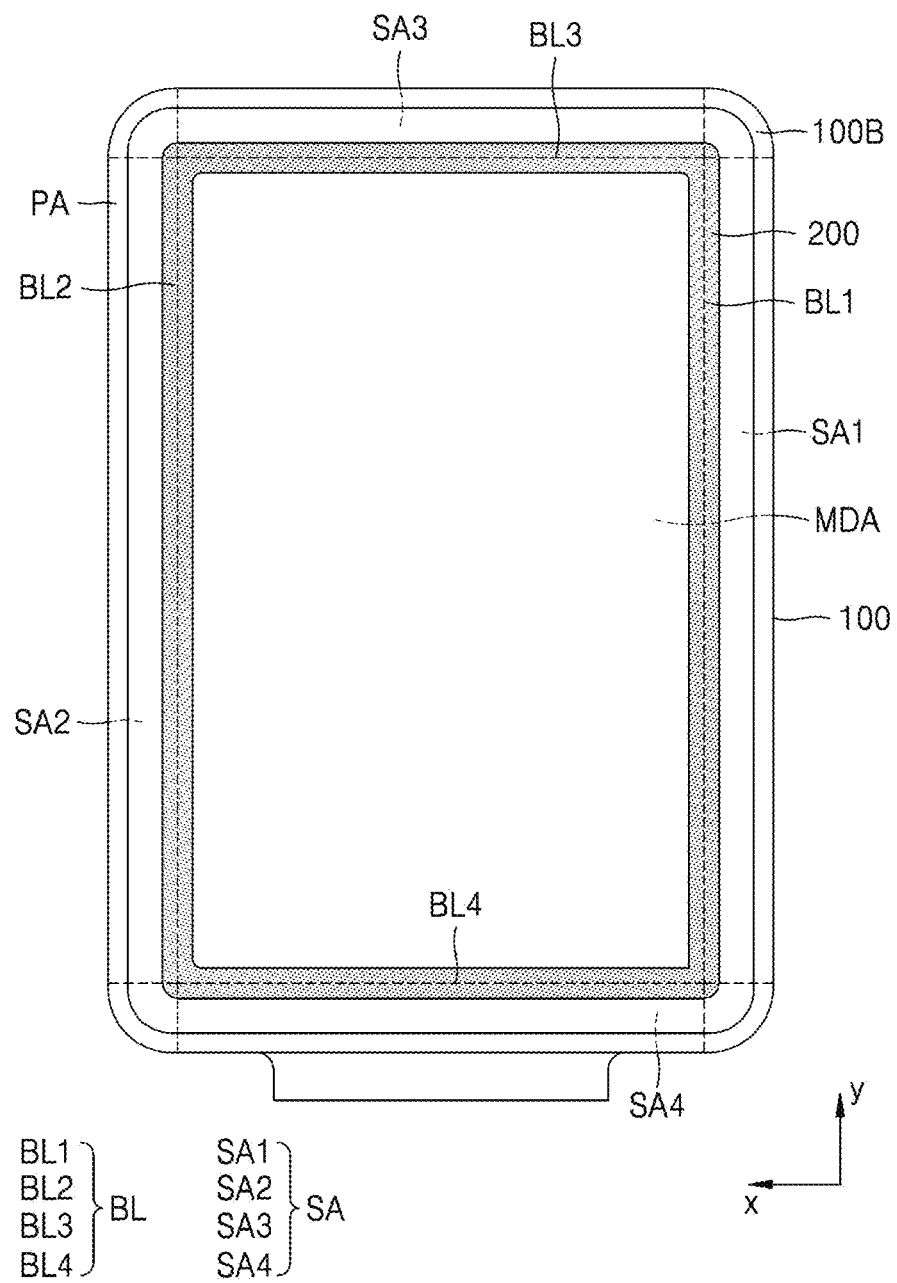
FIG. 11B is a plan view illustrating an embodiment of a lower surface of a substrate of a display panel which is unfolded.
Figure 12:
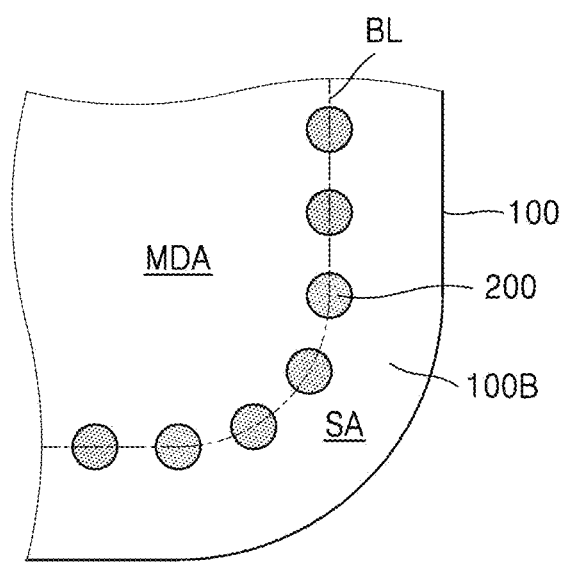
FIG. 12 is a plan view illustrating an embodiment of a portion of a lower surface of a substrate of a display panel which is unfolded.

FIG. 7 is a plan view illustrating an embodiment of the lower surface 100B of the substrate 100 of the display panel 10 which is unfolded. FIGS. 8 to 11A are enlarged plan views of embodiments of region IV of FIG. 7. FIG. 11B is a plan view illustrating an embodiment of the lower surface 100B of the substrate 100 of the display panel 10 which is unfolded. FIG. 12 is a plan view illustrating an embodiment of a portion of the lower surface 100B of the substrate 100 of the display panel 10 which is unfolded.

Referring to FIGS. 7 to 11A, on the lower surface 100B of the substrate 100, the separator 200 may be arranged in various shapes along the bending line BL.

The bending line BL may include one or more of the first bending line BL1, the second bending line BL2, the third bending line BL3, and the fourth bending line BL4. FIG. 7 is for showing the lower surface 100B of the substrate 100 of the display panel 10 and may be understood as illustrating the display panel 10 of FIG. 3 being turned over. Accordingly, unlike that shown in FIG. 3, the first bending line BL1 may be arranged on the right, and the second bending line BL2 may be arranged on the left.

In the lower surface 100B of the substrate 100, the first side area SA1 may be arranged at a right side of the first bending line BL1, and the main display area MDA may be arranged at a left side of the first bending line BL1. The main display area MDA may be arranged at a right side of the second bending line BL2, and the second side area SA2 may be arranged at a left side of the second bending line BL2.

In the lower surface 100B of the substrate 100, the third side area SA3 may be arranged at an upper side of the third bending line BL3, and the main display area MDA may be arranged at a lower side of the third bending line BL3. The main display area MDA may be arranged at an upper side of the fourth bending line BL4, and the fourth side area SA4 may be arranged at a lower side of the fourth bending line BL4.

Figure 8:
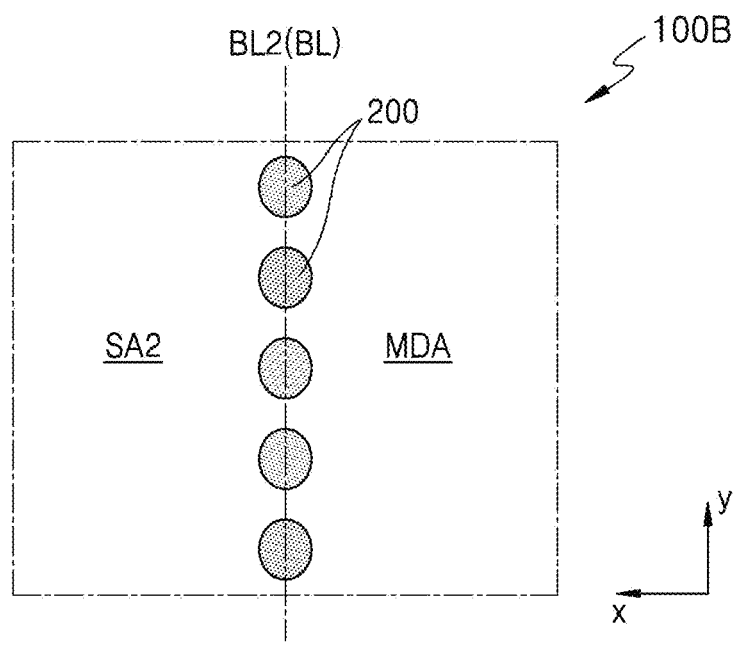
Figure 9:
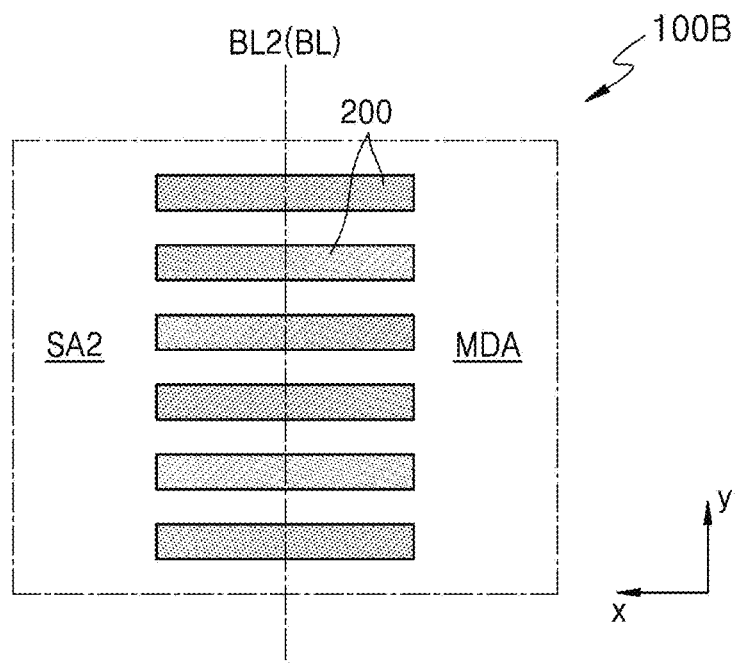
Figure 10:
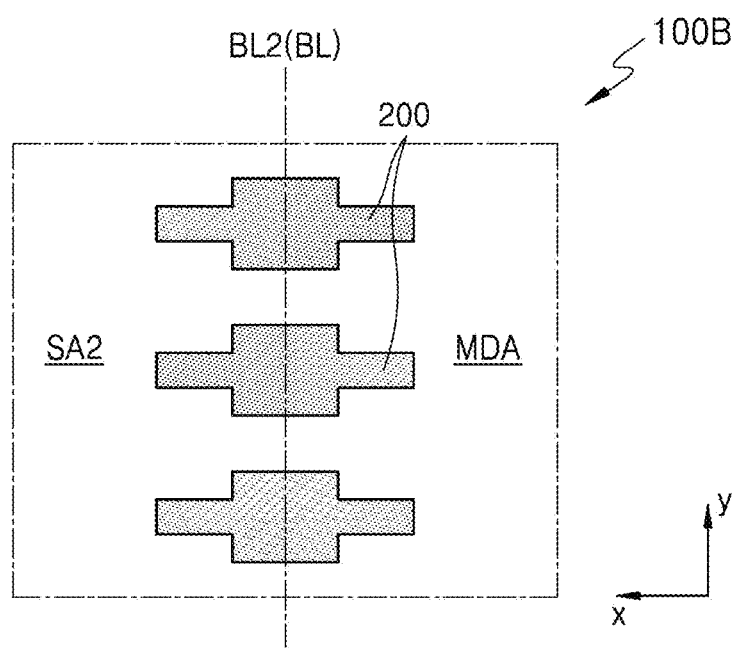

Referring to FIGS. 8 to 10, the separator 200 may include a plurality of separators 200. The plurality of separators 200 may be arranged along the bending line BL and may be spaced apart from each other along the bending line BL. As shown in FIG. 8, the separator 200 may have a circular shape. However, the disclosure is not limited thereto.

The separator 200 may have the shape of a polygon such as a square, a rectangle, or a pentagon. The separators 200 may each be a discrete pattern having a planar shape (e.g., circular, square, rectangle, pentagon, etc.). In embodiments, as shown in FIG. 9, the separator 200 may have a rectangular shape in which a side in the direction x crossing the bending line BL is longer than a side in the direction y.

Referring to FIG. 10, in the separator 200, a portion closer to the bending line BL may have a larger area than a portion farther from the bending line BL. A width of the separator 200 may be defined parallel to a length direction (or extension direction) of the bending line BL. In an embodiment, for example, the separator 200 may have a cross shape, and thus, a width of a central portion in the direction y which is closer to the bending line BL may be greater than that of an edge portion in the direction y which is furthest from the bending line BL.

Although FIGS. 8 to 10 show the separator 200 including the plurality of separators 200, the disclosure is not limited thereto. As shown in FIG. 11A, the separator 200 may be continuously arranged having a width along the bending line BL. That is, the separator 200 may be a single pattern which is continuous along the bending line BL. In this case, as shown in FIG. 11B, on the lower surface 100B of the substrate 100, the separator 200 may be formed in a closed shape corresponding to a shape of the main display area MDA and extend along an entirety of a boundary where the main display area MDA and the side area SA meet each other.

Although FIGS. 8 to 11A show a case in which the bending line BL has a linear shape, the disclosure is not limited thereto. As shown in FIGS. 11B and 12, the bending line BL may be curved in one or more areas. In an embodiment, for example, at a corner portion of the substrate 100, the bending line BL may be curved corresponding to a shape of a corner. Even in this case, the separator 200 may be arranged along the bending line BL.

Figure 13:
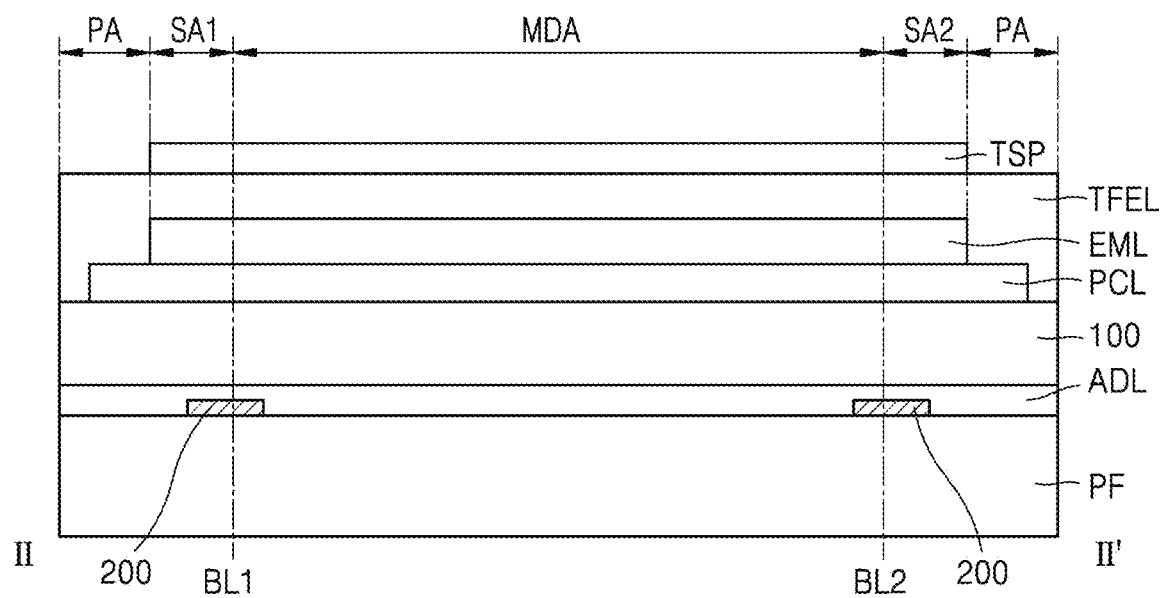
FIG. 13 is a cross-sectional view schematically illustrating an embodiment of a portion of a display panel which is unfolded.

FIG. 13 is a cross-sectional view schematically illustrating an embodiment of a portion of the display panel 10 which is unfolded. In FIG. 13, the same reference numerals as those in FIG. 5 denote the same elements, and thus, redundant descriptions thereof are omitted.

Referring to FIG. 13, the display panel 10 may include the substrate 100, the circuit layer PCL, the display element layer EML, and the thin film encapsulation layer TFEL arranged on the substrate 100, the touchscreen layer TSP, and the optical functional layer. In addition, the display panel 10 may include the protection film PF arranged below the substrate 100. A portion of the display panel 10 may be bendable at the bending line BL. In this regard, the separator 200 corresponding to the bending line BL may be arranged between the substrate 100 and the protection film PF.

Although FIG. 5 shows the separator 200 formed on the lower surface 100B of the substrate 100 to be extended away from the lower surface 100B, the disclosure is not limited thereto. Referring to FIG. 13, the separator 200 may be formed on a protection film upper surface of the protection film PF to be extended toward the lower surface 100B and then be attached to the lower surface 100B of the substrate 100 by the adhesive layer ADL. A distal end of the separator 200 which is furthest from the protection film PF may be spaced apart from the substrate 100, and a portion of the adhesive layer ADL may be between the distal end of the separator 200 and the substrate 100. The adhesive layer ADL may be ultra-thin, and thus, a separator upper surface of the separator 200 which is closest to the substrate 100 may be in contact with the lower surface 100B of the substrate 100. In an embodiment, the separator 200 may be formed on an adhesive layer upper surface of the adhesive layer ADL and then be brought into contact with the lower surface 100B of the substrate 100.

Figure 14:
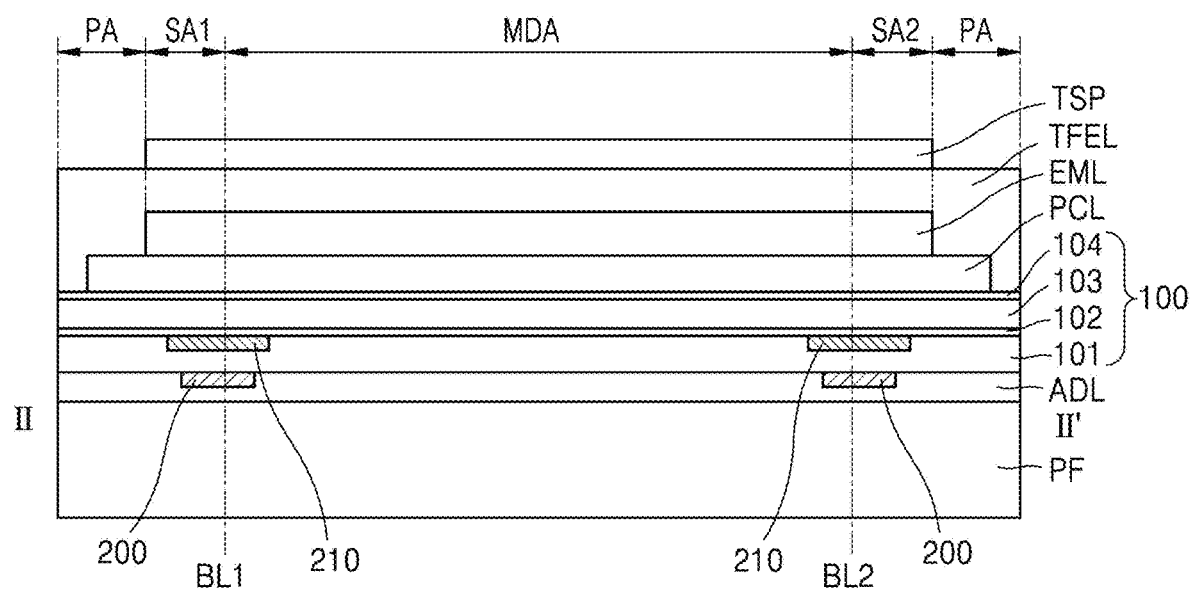
FIG. 14 is a cross-sectional view schematically illustrating an embodiment of a portion of a display panel which is unfolded.

FIG. 14 is a cross-sectional view schematically illustrating an embodiment of a portion of the display panel 10 which is unfolded. In FIG. 14, the same reference numerals as those in FIG. 5 denote the same elements, and thus, redundant descriptions thereof are omitted.

Referring to FIG. 14, the display panel 10 may include the substrate 100, the circuit layer PCL, the display element layer EML, and the thin film encapsulation layer TFEL arranged on the substrate 100, the touchscreen layer TSP, and the optical functional layer. In addition, the display panel 10 may include the protection film PF arranged below the substrate 100. A portion of the display panel 10 may be bendable at the bending line BL. In this regard, the separator 200 corresponding to the bending line BL may be arranged between the substrate 100 and the protection film PF.

The substrate 100 may include a structure in which a first resin layer 101, a first barrier layer 102, a second resin layer 103, and a second barrier layer 104 are stacked.

The first resin layer 101 and the second resin layer 103 may include polymer resin such as polyethersulfone (PES), polyacrylate, polyetherimide (PEI), polyethylene naphthalate (PEN), PET, polyphenylene sulfide (PPS), polyarylate (PAR), PI, PC, or cellulose acetate propionate (CAP).

To reduce or effectively prevent penetration of moisture or oxygen, the first barrier layer 102 may be arranged between the first resin layer 101 and the second resin layer 103. In addition, the second barrier layer 104 may be arranged between the second resin layer 103 and the buffer layer 111 (see FIGS. 6A and 6B). The first barrier layer 102 and the second barrier layer 104 may include an inorganic material such as metal oxide, silicon nitride, or silicon oxide. The first barrier layer 102 and the second barrier layer 104 may include a single layer or a stack of multiple layers.

In the embodiment, an auxiliary separator 210 may be further arranged between the first resin layer 101 and the first barrier layer 102 to correspond to the first and second bending lines BL1 and BL2 to which a plurality of separators 200 respectively correspond. The auxiliary separator 210 may be on a barrier lower surface of the first barrier layer 102 or a first resin layer upper surface of the first resin layer 101. The auxiliary separator 210 may have a different light transmittance or light reflectance from the substrate 100 and the protection film PF. The auxiliary separator 210 may have different light transmittance and light reflectance from the separator 200. The auxiliary separator 210 may be formed by applying ink or depositing and patterning a thin film.

Arrangement of the auxiliary separator 210 may facilitate detection of a crack that may occur in the substrate 100. When the auxiliary separator 210 (e.g., second separator within a second separator layer) is arranged, light transmittance of the separator 200 (e.g., first separator within a first separator layer) may be less than that of the protection film PF and may be greater than that of the auxiliary separator 210. The first separator and the second separator may be in different layers from each other among layers facing the substrate 100. The first separator and the second separator may correspond to a same bending line among the bending lines BL. As being in a same layer, elements may be respective patterns of a same material layer, without being limited thereto.

Figure 15:
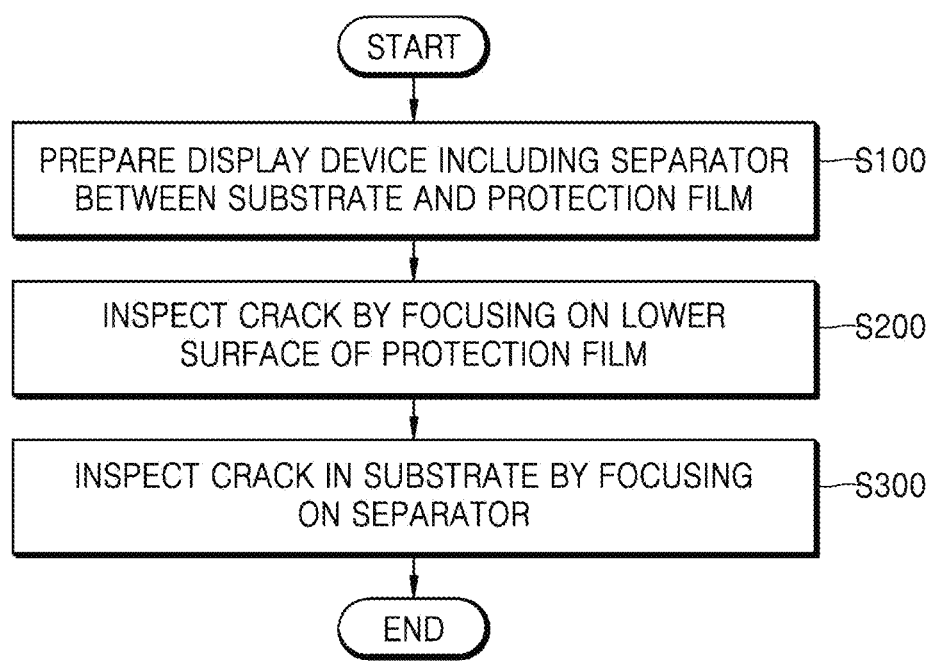
FIG. 15 is a flowchart of an embodiment of a method of detecting a crack in a display device.
Figure 16A:
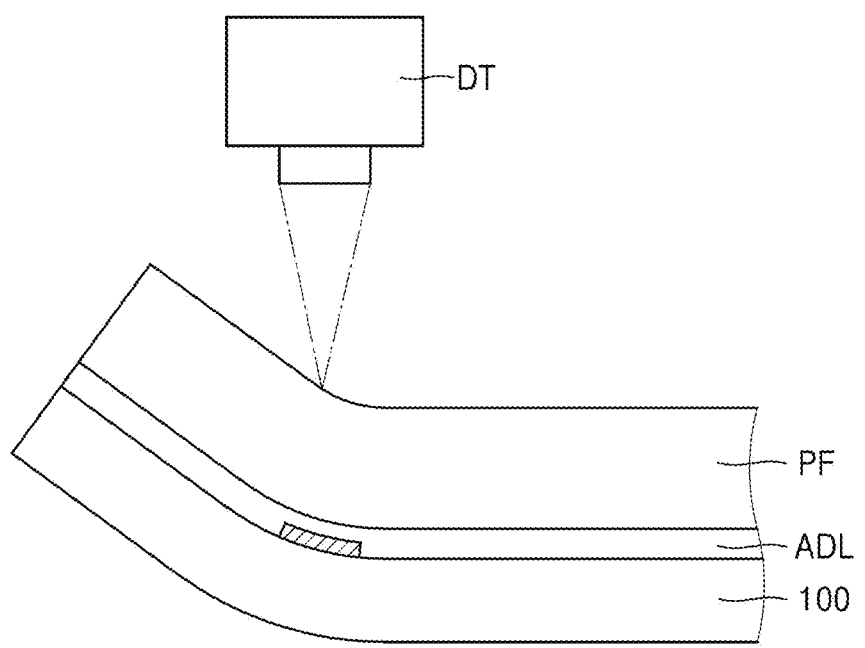
FIGS. 16A and 16B are schematic diagrams of embodiments of processes in a method of detecting a crack.
Figure 16B:
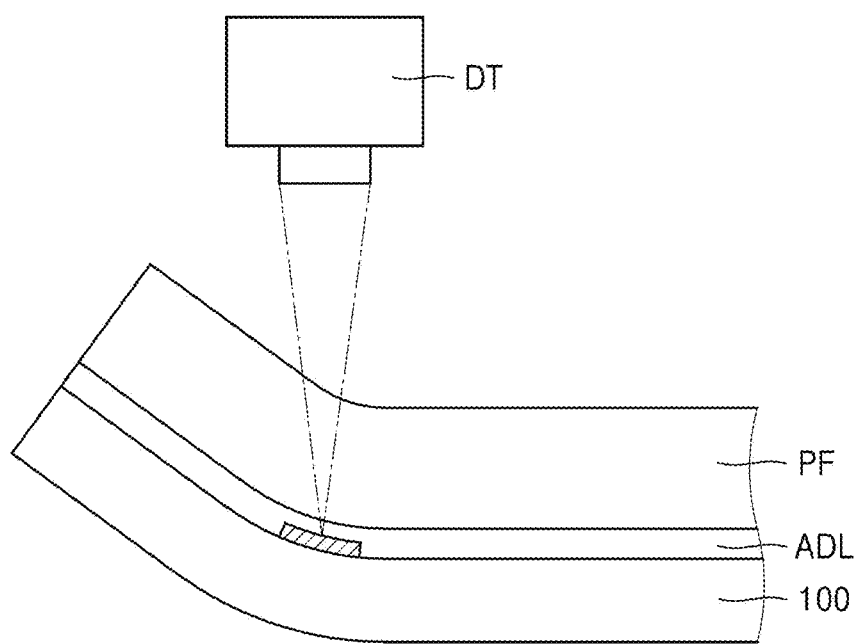

FIG. 15 is a flowchart of an embodiment of a method of detecting a crack in a display device 1. FIGS. 16A and 16B are schematic diagrams of embodiments of processes in a method of detecting a crack.

Referring to FIGS. 15 and 16A, the separator 200 is first formed between the substrate 100 and the protection film PF of the display panel 10 to detect a crack in a display device 1 (in operation S100). That is, the display panel 10 including the separator 200 between the substrate 100 and the protection film PF is prepared. When the display panel 10 is bent about the bending line BL, the separator 200 may be arranged between the substrate 100 and the protection film PF to correspond to the bending line BL. The separator 200 may be in contact with a lower surface 100B of the substrate 100 which is closest to the protection film PF. The separator 200 may include a material on the lower surface 100B of the substrate 100 and having a different light transmittance or light reflectance from those of the substrate 100 and the protection film PF.

Referring to FIGS. 15 and 16A, a protection film lower surface of the protection film PF which is furthest from the substrate 100 is inspected by optically focusing a detector DT on the protection film lower surface of the protection film PF (in operation S200). The detector DT may be a detector using optics, such as a microscope. It may be difficult to determine, only by a crack generated in the protection film lower surface of the protection film PF, whether the crack is a genuine crack or a false crack.

Referring to FIGS. 15 and 16B, the lower surface 100B of the substrate 100 is inspected by optically focusing on the separator 200 (e.g., inspection target) arranged between the protection film PF and the substrate 100 (in operation S300). The separator 200 is in contact with the lower surface 100B of the substrate 100, and accordingly, focusing on the separator 200 may be focusing on the lower surface 100B of the substrate 100. That is, focusing on the separator 200 corresponds to focusing on the lower surface 100B of the substrate 100. In an embodiment, a method of inspecting the display device 1 may include providing the display device 1 including a separator 200 between a substrate 100 and a protection film PF, the substrate 100 including a lower surface 100B closest to the protection film PF and the protection film PF including a protection film lower surface furthest from the substrate 100, providing inspection of the protection film lower surface of the protection film PF by optically focusing a detector DT at a location of the protection film lower surface of the protection film PF which corresponds to the separator 200 (e.g., inspection location target), and after the providing of the inspection of the protection film lower surface of the protection film PF, providing inspection of the lower surface 100B of the substrate 100 by optically focusing the detector DT on the separator 200.

The separator 200 as the inspection location target includes a material having a different light transmittance or light reflectance from those of the substrate 100 and the protection film PF, and accordingly, focusing on the separator 200 may be easier. In addition, the separator 200 as the inspection location target overlaps an area with a high probability of cracking, that is, a portion where the bending line BL is arranged. Accordingly, inspection efficiency may be increased by inspecting an area where the separator 200 is arranged. When a crack in the lower surface 100B of the substrate 100 is not observed, a crack observed in a lower portion of the protection film PF may be determined as a false crack. When a crack in the lower surface 100B of the substrate 100 is observed, a crack observed in a lower portion of the protection film PF may be determined as a genuine crack.

Figure 17A:
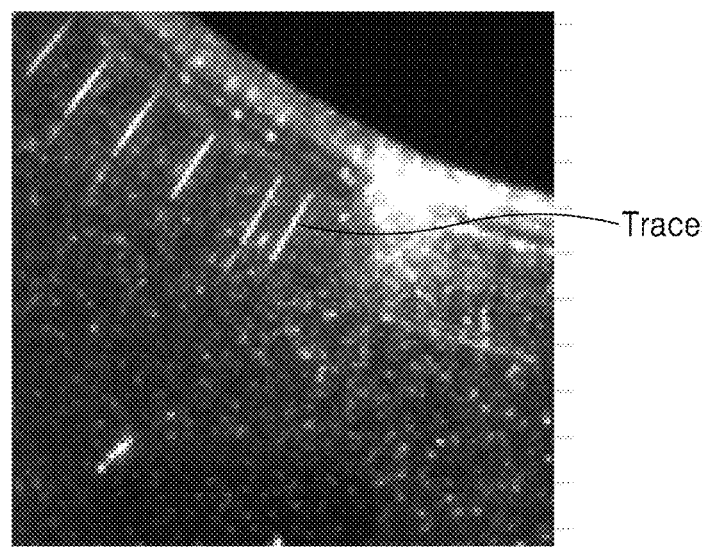
FIGS. 17A and 17B are photographs showing an embodiment of inspection of a display device including a separator.
Figure 17B:
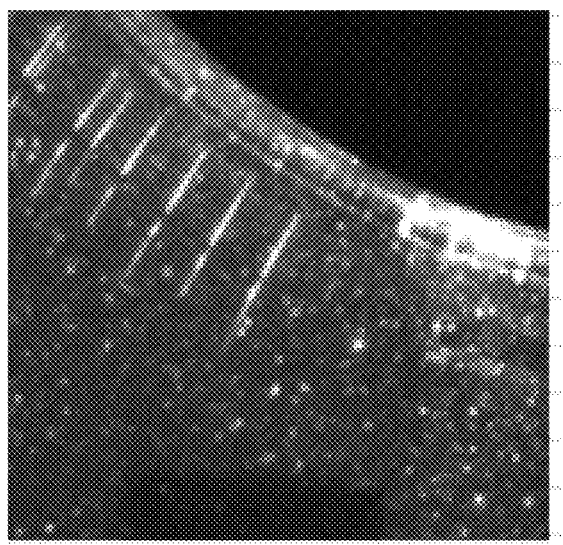

FIGS. 17A and 17B are photographs obtained by inspecting an embodiment of a display device 1 including a separator 200. FIGS. 17A and 17B show a case in which a genuine crack occurs.

FIG. 17A is a photograph obtained by inspecting a protection film lower surface of a protection film PF. Referring to FIG. 17A, white traces are detected on a protection film lower surface of a protection film PF, and the white traces may be determined as cracks. However, it is not clear whether the cracks are genuine or false, based only on the white traces on the protection film lower surface of the protection film PF. Accordingly, a lower surface 100B of a substrate 100 may be further inspected.

FIG. 17B is a photograph obtained by inspecting a lower surface 100B of a substrate 100. Referring to FIG. 17B, white traces visible on the protection film lower surface of the protection film PF are more clearly detected. In this case, the white traces may be determined as genuine cracks.

Figure 18A:
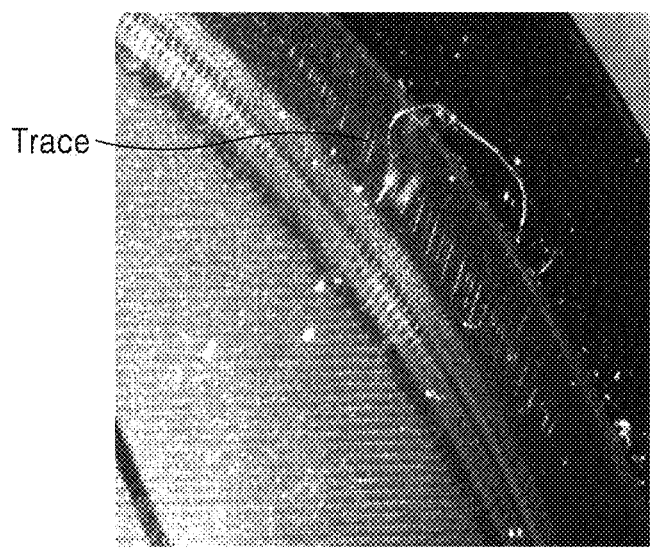
FIGS. 18A and 18B are photographs showing an embodiment of inspection of a display device including a separator.
Figure 18B:
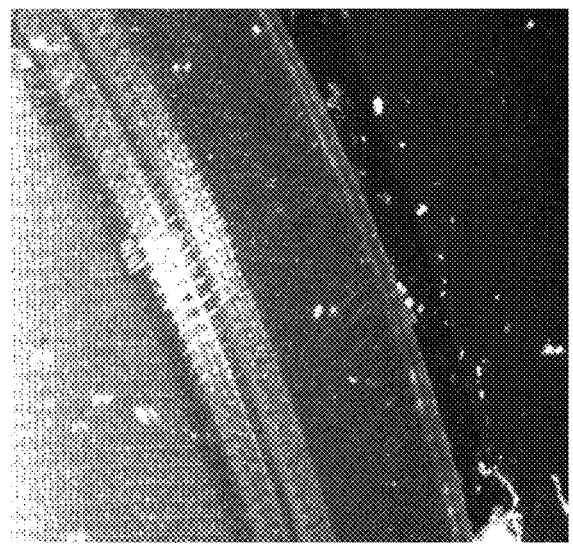

FIGS. 18A and 18B are photographs obtained by inspecting an embodiment of a display device 1 including a separator 200. FIGS. 18A and 18B show a case in which a false crack occurs.

FIG. 18A is a photograph obtained by inspecting a protection film lower surface of a protection film PF. Referring to FIG. 18A, short white traces are detected on a protection film lower surface of a protection film PF, and the white traces may be determined as cracks. However, it is not clear whether the cracks are genuine or false, based only on the white traces on the protection film lower surface of the protection film PF.

FIG. 18B is a photograph obtained by inspecting a lower surface 100B of a substrate 100. Referring to FIG. 18B, white traces are not detected on the protection film lower surface of the protection film. In this case, the white traces appearing on the protection film lower surface of the protection film PF are false tracks, and the lower surface 100B of the substrate 100 may be determined as having no crack.

As described above, in an embodiment of a method of inspecting a display device 1, whether a lower surface 100B of a substrate 100 has a crack may be accurately determined by using one or more embodiment of a separator 200, and thus, inspection efficiency may be improved.

As described above, one or more embodiment of a display device 1 may employ a separator 200 between a substrate 100 and a protection film PF, thereby efficiently performing crack inspection on the display device 1.

However, effects of one or more embodiments are not limited thereto.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate which is bendable about a bending line;
a display element layer facing the substrate;
a protection film facing the display element layer with the substrate therebetween;
a material layer which is between the substrate and the protection film; and
a separator which is between the substrate and the protection film, extends into the material layer and corresponds to the bending line.

2. The display device of claim 1, wherein
the substrate includes a lower surface which is closest to the protection film, and
the separator extends from the lower surface of the substrate and toward the protection film.

3. The display device of claim 1, wherein
the protection film includes an upper surface which is closest to the substrate, and
the separator extends from the upper surface of the protection film and toward the substrate.

4. The display device of claim 1, wherein
the display element layer includes a display element which displays an image, and
the substrate comprises:
a main display area, and
a side area which is bendable about the bending line, at an angle relative to the main display area.

5. The display device of claim 4, wherein the angle at which the side area is bendable relative to the main display area is about 50 degrees to about 100 degrees.

6. The display device of claim 1, further comprising a circuit layer connected to the display element layer, the circuit layer including wires,
wherein the substrate comprises:
a main display area,
a side area which is bendable about the bending line, relative to the main display area, and
the side area including the wires of the circuit layer.

7. The display device of claim 1, wherein the separator is provided in plural comprising a plurality of separators spaced apart from each other along the bending line.

8. The display device of claim 7, wherein each of the plurality of separators has a circular or polygonal shape.

9. The display device of claim 1, wherein the separator is a single pattern which is continuous along the bending line.

10. The display device of claim 1, wherein the bending line which corresponds to the separator is curved.

11. The display device of claim 1, further comprising an auxiliary separator which corresponds to the bending line and the separator,
wherein
the substrate comprises a first resin layer, a first barrier layer, a second resin layer, and a second barrier layer in order from the protection film, and
the auxiliary separator is between the first resin layer and the first barrier layer.

12. The display device of claim 1, wherein
each of the substrate, the protection film and the separator includes a material having a light transmittance and a light reflectance, and
the light transmittance and the light reflectance of the separator is different from the light transmittance and the light reflectance of each of the substrate and the protection film.

13. The display device of claim 1, wherein the separator which is between the substrate and the protection film and corresponds to the bending line comprises black ink.

* * * * *